(12) United States Patent
Won et al.

(10) Patent No.: US 11,659,742 B2
(45) Date of Patent: May 23, 2023

(54) DISPLAY PANEL HAVING A FIRST CORNER DISPLAY AREA DISPOSED BETWEEN A PERIPHERAL AREA AND A SECOND CORNER DISPLAY AREA AND DISPLAY APPARATUS INCLUDING THE SAME

(71) Applicant: SAMSUNG DISPLAY CO., LTD., Yongin-si (KR)

(72) Inventors: Byeonghee Won, Yongin-si (KR); Jaemin Shin, Yongin-si (KR); Jongho Hong, Yongin-si (KR); Jangyeol Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 109 days.

(21) Appl. No.: 17/147,742

(22) Filed: Jan. 13, 2021

(65) Prior Publication Data

US 2021/0376038 A1    Dec. 2, 2021

(30) Foreign Application Priority Data

Jun. 1, 2020   (KR) .................. 10-2020-0066014

(51) Int. Cl.
| | | |
|---|---|---|
| *H01L 27/14* | (2006.01) | |
| *H01L 27/32* | (2006.01) | |
| *G09G 3/3266* | (2016.01) | |
| *H01L 51/00* | (2006.01) | |
| *G09G 3/00* | (2006.01) | |

(Continued)

(52) U.S. Cl.
CPC ....... *H01L 27/3276* (2013.01); *G09G 3/3266* (2013.01); *H01L 27/3262* (2013.01);

(Continued)

(58) Field of Classification Search
CPC ............ H01L 27/3276; H01L 27/3262; H01L 27/3265; H01L 27/1265; H01L 27/3211

(Continued)

(56) References Cited

U.S. PATENT DOCUMENTS 9,281,349 B2   3/2016   Park et al.
9,666,535 B2   5/2017   Song et al.

(Continued)

FOREIGN PATENT DOCUMENTS

CN         102629440 B       1/2015
KR      1020140140987 A     12/2014

(Continued)

OTHER PUBLICATIONS

Extended European Search Report for Application No. 21165041.1 dated Sep. 17, 2021, citing the above reference(s).

*Primary Examiner* — Phuc T Dang
(74) *Attorney, Agent, or Firm* — Cantor Colburn LLP

(57) ABSTRACT

A display panel includes: a substrate including a main display area, a first corner display area, a second corner display area, and a peripheral area, where the second corner display area extends from a corner of the main display area, the first corner display area is disposed between the peripheral area and the second corner display area, and the peripheral area surrounds the main display area, the first corner display area and the second corner display area; a first gate driving circuit arranged on the second corner display area of the substrate; a first line connected to the first gate driving circuit and extending toward the main display area; and a second line connected to the first gate driving circuit and extending toward the first corner display area.

19 Claims, 25 Drawing Sheets

(51) Int. Cl.
   *G09G 3/3241*    (2016.01)
   *H01L 27/12*     (2006.01)
(52) U.S. Cl.
   CPC ...... *H01L 27/3265* (2013.01); *H01L 51/0097*
       (2013.01); *G09G 3/035* (2020.08); *G09G*
       *3/3241* (2013.01); *G09G 2300/0426* (2013.01);
       *H01L 27/1255* (2013.01); *H01L 27/3211*
       (2013.01); *H01L 2251/5338* (2013.01)
(58) Field of Classification Search
   USPC ......................................................... 257/72
   See application file for complete search history.

(56)               References Cited

U.S. PATENT DOCUMENTS

| | | |
|---|---|---|
| 10,446,635 B2 | 10/2019 | Moon et al. |
| 11,094,895 B2 | 8/2021 | Dai |
| 2017/0219895 A1 | 8/2017 | Yu et al. |
| 2018/0149794 A1* | 5/2018 | Oh ........................ G02B 6/0061 |
| 2019/0081127 A1* | 3/2019 | Shim ..................... G09G 3/3291 |
| 2019/0140044 A1 | 5/2019 | Park et al. |
| 2019/0146548 A1* | 5/2019 | Li .......................... G06F 1/1601 |
| | | 361/679.01 |
| 2019/0148475 A1* | 5/2019 | Seo ..................... H01L 51/5203 |
| | | 445/25 |
| 2019/0229160 A1 | 7/2019 | Lee et al. |

FOREIGN PATENT DOCUMENTS

| | | |
|---|---|---|
| KR | 1020180082688 A | 7/2018 |
| KR | 1020190090417 A | 8/2019 |
| WO | 2019223776 A1 | 11/2019 |

* cited by examiner

DISPLAY PANEL HAVING A FIRST CORNER DISPLAY AREA DISPOSED BETWEEN A PERIPHERAL AREA AND A SECOND CORNER DISPLAY AREA AND DISPLAY APPARATUS INCLUDING THE SAME

This application claims priority to Korean Patent Application No. 10-2020-0066014, filed on Jun. 1, 2020, and all the benefits accruing therefrom under 35 U.S.C. § 119, the content of which in its entirety is herein incorporated by reference.

BACKGROUND

1. Field

One or more embodiments relate to a display panel and a display apparatus including the display panel, and more particularly, to a display panel in which a display area where an image is displayed is expanded and a display apparatus including the display panel.

2. Description of Related Art

A display apparatus may visually display data. The display apparatus may be used as a display unit of a small product such as a mobile phone or may be used as a display unit of a large product such as a television.

Such a display apparatus may include a substrate divided into a display area and a non-display area, and a gate line and a data line may be formed and insulated from each other in the display area. The gate line and the data line may intersect each other to define a plurality of pixel regions in the display area, and the plurality of pixel regions may receive electrical signals and emit light to display an image. A thin film transistor and a pixel electrode electrically connected to the thin film transistor may be arranged to correspond to each of the pixel regions, and an opposite electrode may be commonly arranged in the pixel regions. The non-display area may include various lines configured to transmit electrical signals to the display area, a gate driver, a data driver, a controller, and the like.

The display apparatus has been used for various purposes. Also, as the display apparatus becomes thinner and lighter, its range of use has widened. As the number of users thereof has increased, research has been actively conducted to visually satisfy the users. For example, a display area of the display apparatus may be expanded. Particularly, research has been actively conducted to display images also on side and corner portions of the display apparatus in order to expand a display area of the display apparatus.

SUMMARY

However, in such a display panel of the related art and the display apparatus including the display panel, there is a problem in that a pixel circuit and a light emitting device may not be arranged in a corner portion where one side and another side of the display apparatus meet each other and thus a display area may not be expanded.

In order to solve various problems including the above problems, one or more embodiments include a display panel in which a display area where an image is displayed is expanded and a display apparatus including the display panel. However, these problems are merely examples, and the scope of the disclosure is not limited thereto.

Additional aspects will be set forth in part in the description which follows and, in part, will be apparent from the description, or may be learned by practice of the embodiments.

According to one or more embodiments, a display panel includes a substrate including a main display area, a first corner display area, a second corner display area, and a peripheral area, where the second corner display area extends from a corner of the main display area, the first corner display area is disposed between the peripheral area and the second corner display area, and the peripheral area surrounds the main display area, the first corner display area and the second corner display area; a first gate driving circuit arranged on the second corner display area of the substrate; a first line connected to the first gate driving circuit and extending toward the main display area; and a second line connected to the first gate driving circuit and extending toward the first corner display area.

According to an example, the display panel may further include a corner light emitting device arranged on the second corner display area of the substrate, and a pixel circuit connected to the corner light emitting device and which drives the corner light emitting device, where the pixel circuit may be arranged in the main display area or the first corner display area.

According to an example, the pixel circuit may include a semiconductor layer arranged on the substrate, and a gate electrode arranged on the semiconductor layer and overlapping at least part of the semiconductor layer in a plan view, where the first line and the second line may each include the same material as the gate electrode.

According to an example, the display panel may further include a second gate driving circuit arranged in the second corner display area and spaced apart from the first gate driving circuit, and a first bridge line connected to the first line and the second line through contact holes and arranged between the first gate driving circuit and the second gate driving circuit.

According to an example, the first line and the second line may be provided in plural, a $(1\text{-}1)^{st}$ line among the plurality of first lines may be connected to a $(2\text{-}1)^{st}$ line among the plurality of second lines, and in a state where the substrate is unfolded, a virtual extending line of the $(2\text{-}1)^{st}$ line may be on the same line as a $(1\text{-}2)^{nd}$ line.

According to an example, the first corner display area of the substrate may include a plurality of strip portions extending from the second corner display area toward the peripheral area, and a plurality of through-portions may be defined between the plurality of strip portions and pass through the substrate.

According to an example, an area of the plurality of through-portions may vary with a force applied to the first corner display area.

According to an example, the first corner display area of the substrate may include a plurality of islands, and a plurality of connection portions connecting the plurality of islands to each other, and a plurality of through-portions may be defined between the plurality of islands and the plurality of connection portions and pass through the substrate.

According to an example, the display panel may further include a third line arranged on the main display area, the first corner display area, and the second corner display area of the substrate and extending in a direction intersecting with the first line.

According to an example, the display panel may further include a first initialization voltage supply line arranged between the main display area and the first corner display area, and a common voltage supply line arranged between the main display area and the first corner display area.

According to an example, the display panel may further include a first gate driving circuit and a second gate driving circuit arranged on the second corner display area of the substrate and spaced apart from each other, a second initialization voltage supply line arranged in a part of the second corner display area adjacent to the first corner display area, and a third initialization voltage supply line arranged in the second corner display area, connecting the first initialization voltage supply line to the second initialization voltage supply line, and arranged between the first gate driving circuit and the second gate driving circuit.

According to an example, the display panel may further include a plurality of sub connection lines connected to the common voltage supply line and extending from the second corner display area toward the first corner display area.

According to an example, the display panel may further include a first driving voltage supply line arranged in a part of the peripheral area adjacent to the main display area, a second driving voltage supply line arranged in a part of the peripheral area adjacent to the first corner display area, and a third bridge line connecting the first driving voltage supply line and the second driving voltage supply line.

According to an example, the display panel may further include a plurality of first driving voltage lines connected to the first driving voltage supply line and extending toward the main display area, and a plurality of second driving voltage lines connected to the second driving voltage supply line and extending toward the first corner display area, where the numbers of pixels respectively connected to the plurality of second driving voltage lines and located in the same column in the first corner display area may be different from each other.

According to an example, the display panel may further include a first driving voltage supply line arranged in a part of the peripheral area adjacent to the main display area and connected to a first pad unit, and a second driving voltage supply line arranged in a part of the peripheral area adjacent to the first corner display area and connected to a second pad unit.

According to one or more embodiments, a display panel includes a substrate including a main display area, a first corner display area, a second corner display area arranged between the main display area and the first corner display area, and a peripheral area at one side of the main display area, the first corner display area and the second corner display area; a first gate driving circuit and a second gate driving circuit arranged on the second corner display area of the substrate and spaced apart from each other, a first vertical line arranged in the main display area and connected to a terminal arranged in the peripheral area, a second vertical line arranged in the first corner display area, and a second bridge line connecting the first vertical line and the second vertical line and arranged between the first gate driving circuit and the second gate driving circuit.

According to an example, the display panel may further include a first horizontal line connected to the first gate driving circuit, intersecting with the first vertical line, and extending toward the main display area, and a second horizontal line connected to the first gate driving circuit, intersecting with the second vertical line, and extending toward the first corner display area.

According to an example, the first vertical line and the second vertical line may be provided in plural, a $(1\text{-}1)^{st}$ vertical line among the plurality of first vertical lines may be connected to a $(2\text{-}1)^{st}$ vertical line among the plurality of second vertical lines, and in a state where the substrate is unfolded, a virtual extending line of the $(1\text{-}1)^{st}$ vertical line may be on the same line as a $(2\text{-}2)^{nd}$ vertical line.

According to one or more embodiments, a display apparatus includes a display panel including a main display area, a first corner display area, and a second corner display area, where the second corner display area extends from a corner of the main display area, and the first corner display area is disposed outside the second corner display area and curved with a first curvature radius; and a window covering the display panel. The display panel further includes a first gate driving circuit arranged in the second corner display area, a first line connected to the first gate driving circuit and extending toward the main display area, and a second line connected to the first gate driving circuit and extending toward the first corner display area.

According to an example, the first corner display area of the display panel may include a plurality of strip portions extending from the second corner display area, and a plurality of through-portions may be defined between the plurality of strip portions and pass through the display panel.

According to an example, the display panel may further include a third line arranged in the main display area, the first corner display area, and the second corner display area and extending in a direction intersecting with the first line.

According to an example, the main display area may include a front display area, a first side display area extending from a first side of the front display area and curved with a second curvature radius, and a second side display area extending from a second side of the front display area and curved with a third curvature radius, and the first corner display area may be arranged between the first side display area and the second side display area.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
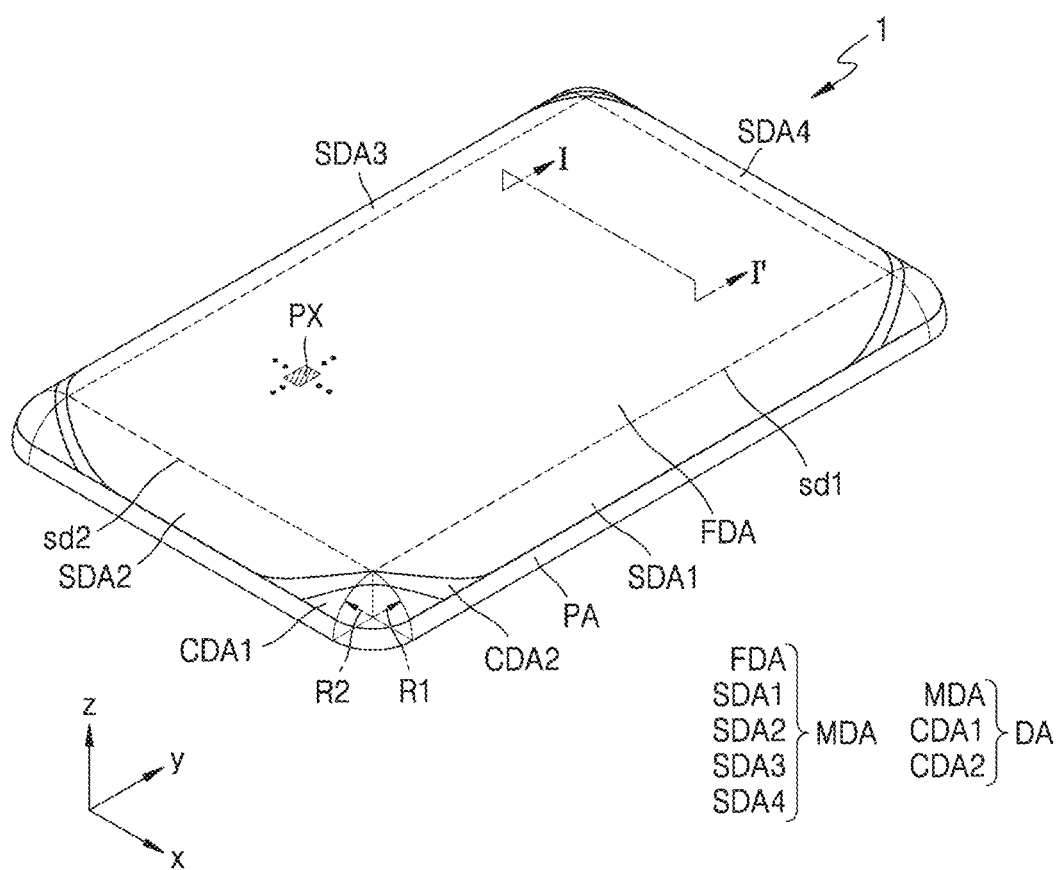
FIG. 1 is a perspective view schematically illustrating a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a perspective view schematically illustrating a display apparatus according to an embodiment.

Referring to FIG. 1, a display apparatus 1 may include a display area DA that emits light and a peripheral area PA that does not emit light. The peripheral area PA may be arranged adjacent to and surround the display area DA. The display apparatus 1 may provide a certain image by using light emitted from a plurality of pixels PX arranged in the display area DA.

The display area DA may include a front display area FDA, a first side display area SDA1, a second side display area SDA2, a third side display area SDA3, and a fourth side display area SDA4.

The first side display area SDA1 may correspond to an area extending from a first side sd1 of the front display area FDA and curved with a first curvature radius R1, and the second side display area SDA2 may correspond to an area extending from a second side sd2 of the front display area FDA and curved with a second curvature radius R2. In this case, the first curvature radius R1 and the second curvature radius R2 may be equal to or different from each other. Also, the first curvature radius R1 and the second curvature radius R2 may not be fixed but may be flexible. That is, the first curvature radius R1 and the second curvature radius R2 may vary according to a location. Although the first side display area SDA1 and the second side display area SDA2 have been described as a reference, the third side display area SDA3 and the fourth side display area SDA4 may also be similarly applied.

The display area DA may further include a first corner display area CDA1 and a second corner display area CDA2. The second corner display area CDA2 of the display area DA may extend from a corner of the front display area FDA. The first corner display area CDA1 may be arranged between the first side display area SDA1 and the second side display area SDA2 and may be curved with a preset curvature. The second corner display area CDA2 may be arranged between the front display area FDA and the first corner display area CDA1 and may be partially curved like the first corner display area CDA1.

Herein, the term "main display area MDA" will be used to refer to a display area other than the first corner display area CDA1 and the second corner display area CDA2 in the display area DA. That is, the main display area MDA may include the front display area FDA, the first side display area SDA1, the second side display area SDA2, the third side display area SDA3, and the fourth side display area SDA4. The second corner display area CDA2 may extend from a corner of the front display area FDA and a portion of the main display area MDA near the corner. The first corner display area CDA1 may be disposed between the second corner display area CDA2 and the peripheral area PA.

The first corner display area CDA1 and the second corner display area CDA2 may include an area emitting light and thus may correspond to an area displaying an image. The second corner display area CDA2 may correspond to an area displaying an image; however, gate driving circuits providing electrical signals to be applied to the pixels PX may be arranged in the second corner display area CDA2, unlike in the main display area MDA and the first corner display area CDA1. This will be described below in detail with reference to FIGS. 9A and 9B. In another embodiment, gate driving circuits providing electrical signals to be applied to the pixels PX may be arranged in each of the first to fourth side display areas SDA1, SDA2, SDA3, and SAD4 in the main display area MDA.

As described above, the first curvature radius R1 of the first side display area SDA1 and the second curvature radius R2 of the second side display area SDA2 may be different from each other. As such, because the first corner display area CDA1 is arranged between the first side display area SDA1 and the second side display area SDA2 having different curvature radiuses, the first corner display area CDA1 may correspond to an area having a plurality of curvature radiuses. That is, the first corner display area CDA1 may have various curvature radiuses depending on a location and a direction.

Although an organic light emitting display apparatus will be described as an example of the display apparatus 1 according to an embodiment, the display apparatus 1 of according to the invention is not limited thereto. In other embodiments, the display apparatus 1 according to the invention may be a display apparatus such as an inorganic light emitting display apparatus or a quantum dot light emitting display apparatus.

A plurality of pixels PX may be arranged in the display area DA. Hereinafter, each pixel PX may mean each of subpixels emitting different colors, and each pixel PX may be, for example, one of a red (R) subpixel, a green (G) subpixel, and a blue (B) subpixel.

The peripheral area PA may be an area that does not provide an image, and a scan driver and a data driver for providing electrical signals to be applied to the pixels PX of the display area DA and power lines for providing power voltages such as a driving voltage and a common voltage may be arranged in the peripheral area PA.

Figure 2:
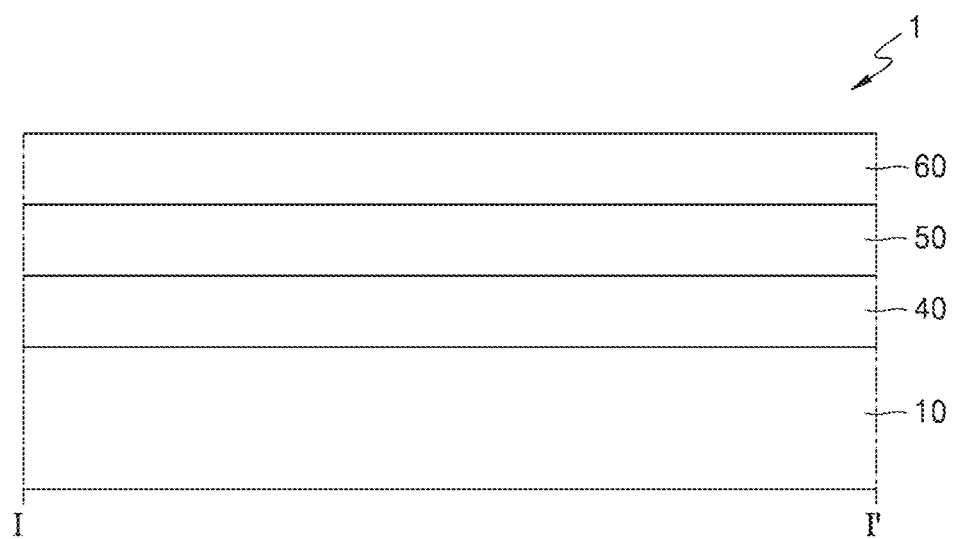
FIG. 2 is a cross-sectional view briefly illustrating a display apparatus according to an embodiment, which corresponds to a cross-section taken along line I-I' of FIG. 1.
Figure 2:
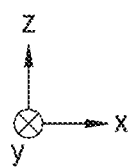

FIG. 2 is a cross-sectional view briefly illustrating a display apparatus according to an embodiment, which may correspond to a cross-section taken along line I-I' of FIG. 1.

Referring to FIG. 2, the display apparatus 1 may include a display panel 10, an input sensing layer 40 arranged on the display panel 10, and an optical functional layer 50, which may be covered by a window 60.

The display panel 10 may display an image. The display panel 10 may include pixels PX arranged in the display area DA. The pixels PX may include a light emitting device and a pixel circuit connected thereto. The light emitting device may include an organic light emitting diode, an inorganic light emitting diode, or a quantum dot light emitting diode.

The input sensing layer 40 may be configured to acquire coordinate information of an external input, for example, a touch event. The input sensing layer 40 may include a sensing electrode or a touch electrode and trace lines connected to the sensing electrode. The input sensing layer 40 may be arranged on the display panel 10. The input sensing layer 40 may be configured to sense an external input by a mutual capacitance method and/or a self capacitance method.

The input sensing layer 40 may be directly formed on the display panel 10 or may be separately formed and then coupled through an adhesive layer such as an optically clear adhesive ("OCA"). For example, the input sensing layer 40 may be subsequently formed after a process of forming the display panel 10. In this case, the input sensing layer 40 may be a portion of the display panel 10, and an adhesive layer may not be arranged between the input sensing layer 40 and the display panel 10. FIG. 2 illustrates that the input sensing layer 40 is arranged between the display panel 10 and the optical functional layer 50; however, in other embodiments, the input sensing layer 40 may be arranged on the optical functional layer 50.

The optical functional layer 50 may include an anti-reflection layer. The anti-reflection layer may be configured to reduce the reflectance of light (external light) incident from the outside toward the display panel 10 through the window 60. The anti-reflection layer may include a phase retarder and a polarizer. The window 60 may be arranged on the optical functional layer 50. The window 60 may protect the display panel 10, the input sensing layer 40, and the optical functional layer 50 from an external impact. The window 60 may include glass or plastic having flexible characteristics and may have transparent characteristics to transmit light generated from the display panel 10. An adhesive layer (not illustrated) may be arranged between the window 60 and the optical functional layer 50 or the input sensing layer 40 to adhere them to each other.

Figure 3:
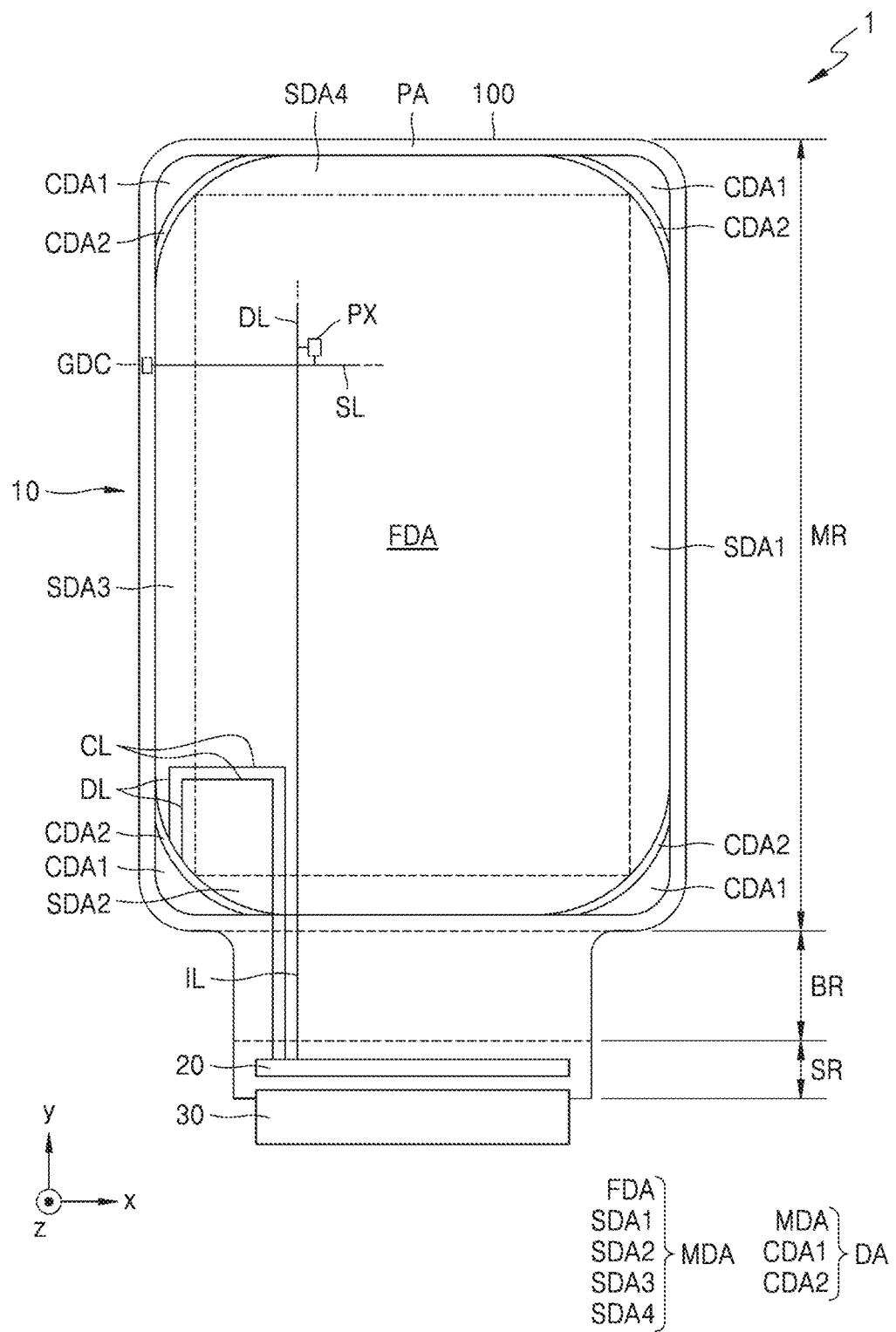
FIG. 3 is a plan view schematically illustrating a display apparatus according to an embodiment.

FIG. 3 is a plan view schematically illustrating a display apparatus according to an embodiment. Although a portion of the display apparatus according to an embodiment may be bent, FIG. 3 illustrates that the display apparatus is not bent, for convenience. Particularly, FIG. 3 may show an unbent state of the display apparatus of FIG. 1.

Referring to FIG. 3, the display apparatus 1 may include a display panel 10. The display apparatus 1 including the display panel 10 may be used in various electronic apparatuses. For example, the display apparatus 1 may be used in electronic devices such as smartphones, tablets, laptops, televisions, or billboards.

The display panel 10 may include a display area DA and a peripheral area PA outside the display area DA. Here, the display area DA may include the main display area MDA, the first corner display area CDA1, and the second corner display area CDA2 described above with reference to FIG. 1. Moreover, because the display panel 10 includes a substrate 100, it may be said that the substrate 100 includes the main display area MDA, the first corner display area CDA1, the second corner display area CDA2, and the peripheral area PA.

Also, the display panel 10 may include a main region MR, a bending region BR outside the main region MR, and a subregion SR located opposite the main region MR with respect to the bending region BR. In the bending region BR, the display panel 10 may be bent such that at least a portion of the subregion SR may overlap the main region MR in a plan view. However, the disclosure according to the invention is not limited to the bent display apparatus 1 and may also be applied to a non-bent display apparatus 1. The subregion SR may be a non-display area. By allowing the display panel 10 to be bent in the bending region BR, the subregion SR may not be viewed or the viewed area of the subregion SR may be minimized, when the display apparatus 1 is viewed from the front.

A driving chip 20 may be arranged in the subregion SR of the display panel 10. The driving chip 20 may include an integrated circuit for driving the display panel 10. The integrated circuit may be a data driving integrated circuit for generating a data signal; however, the disclosure according to the invention is not limited thereto.

The driving chip 20 may be attached to the subregion SR of the display panel 10. The driving chip 20 may be attached onto the same surface as the display surface of the display area DA; however, as the display panel 10 is bent in the bending region BR as described above, the driving chip 20 may be located on the rear surface of the main region MR. Here, the rear surface is a surface of the main region MR opposite the display surface.

A printed circuit board 30 or the like may be attached to an end portion of the subregion SR of the display panel 10. The printed circuit board 30 may be electrically connected to the driving chip 20 or the like through a pad (not illustrated) on the substrate 100.

The display panel 10 may include the substrate 100. The substrate 100 may include glass, metal, and/or polymer resin. When the display panel 10 is bent in the bending region BR as described above, the substrate 100 may have flexible or bendable characteristics. In this case, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. However, the substrate 100 may be modified in various ways, such as including a multilayer structure including two layers and a barrier layer located between the two layers. The two layers may include the polymer resin and the barrier layer may include an inorganic material (e.g., silicon oxide, silicon nitride, or silicon oxynitride).

The display panel 10 may include a plurality of pixels PX arranged in the display area DA, and each of the plurality of pixels PX may include a light emitting device. Herein, an organic light emitting diode ("OLED") will be described as an example of the light emitting device. Each pixel PX may be electrically connected to peripheral circuits arranged in the peripheral area PA. For example, a gate driving circuit GDC may be arranged in the peripheral area PA.

The gate driving circuit GDC may provide a scan signal to each pixel PX through a scan line SL. Although not illustrated in FIG. 2, an emission control driving circuit may also be included in the gate driving circuit GDC, and an emission control signal may be provided to each pixel PX through an emission control line.

Also, as described above, the driving chip 20 may be a data driving integrated circuit generating a data signal, and the driving chip 20 may provide a data signal to each pixel PX through a data line DL connected to an input line IL.

In an embodiment, connection lines CL for transmitting an electrical signal supplied from the driving chip 20 to lines connected to each pixel PX may be located in the display area DA. For example, the connection lines CL may be connected to data lines DL to transmit a data signal supplied from the driving chip 20 to the data lines DL. Moreover, because the length of one side of the display area DA adjacent to the driving chip 20 is greater than the length of the driving chip 20, the connection lines CL may be widely spread to correspond to one side of the display area DA at a position corresponding to the driving chip 20. For this purpose, as illustrated in FIG. 2, the connection lines CL may extend in a first direction (e.g., the x direction) and then may be bent in a direction parallel to a second direction (e.g., the y direction) that is a direction perpendicular to the first direction and may extend toward an edge of the display area DA. In this case, because the area of the peripheral area PA may be reduced as compared to the case of related art in which fan-out lines are located in the peripheral area PA, the dead area of the display apparatus 1 may be reduced.

Figure 4A:
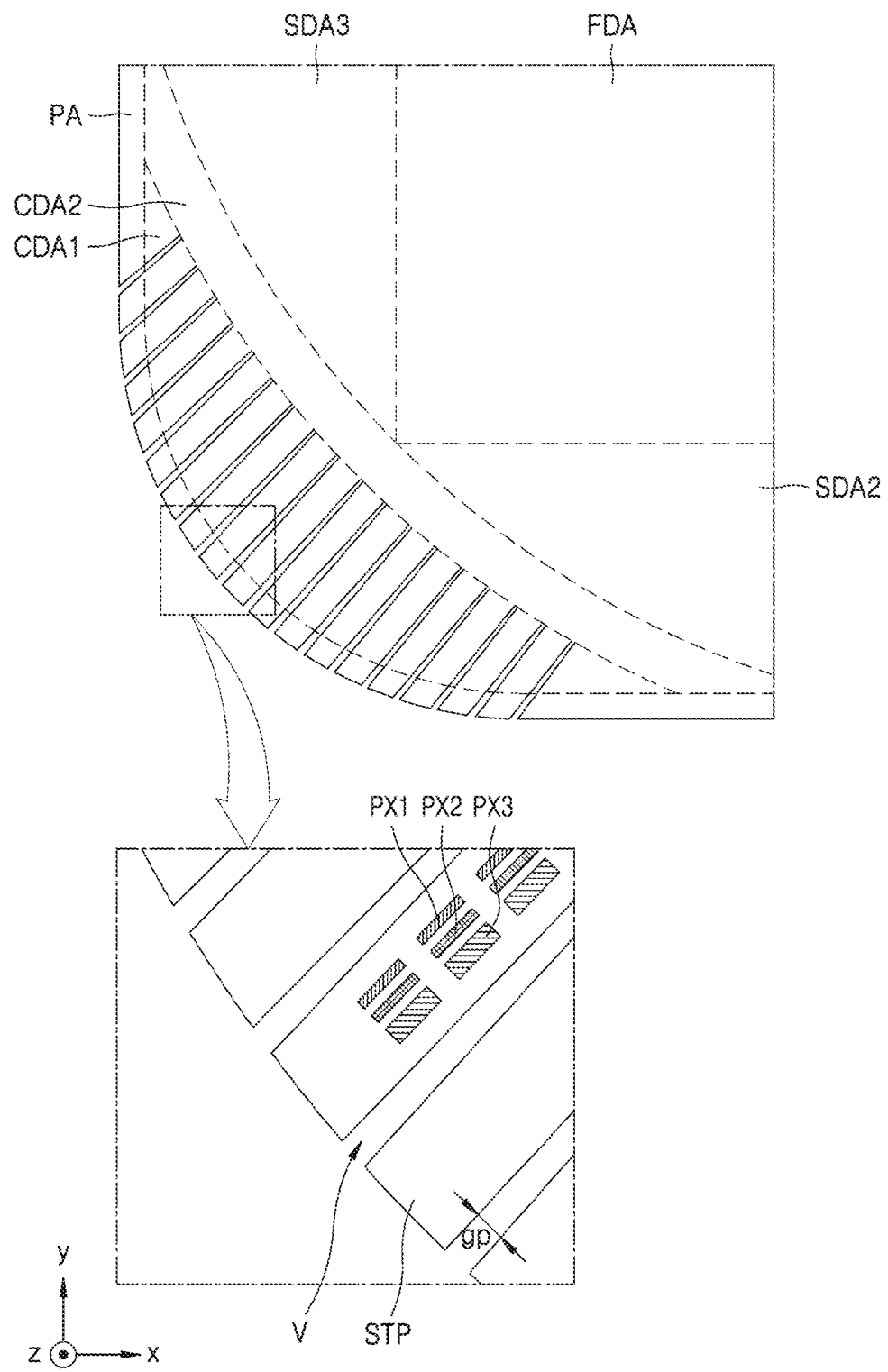
FIGS. 4A and 4B are enlarged plan views schematically illustrating a portion of a display panel according to an embodiment.
Figure 4B:
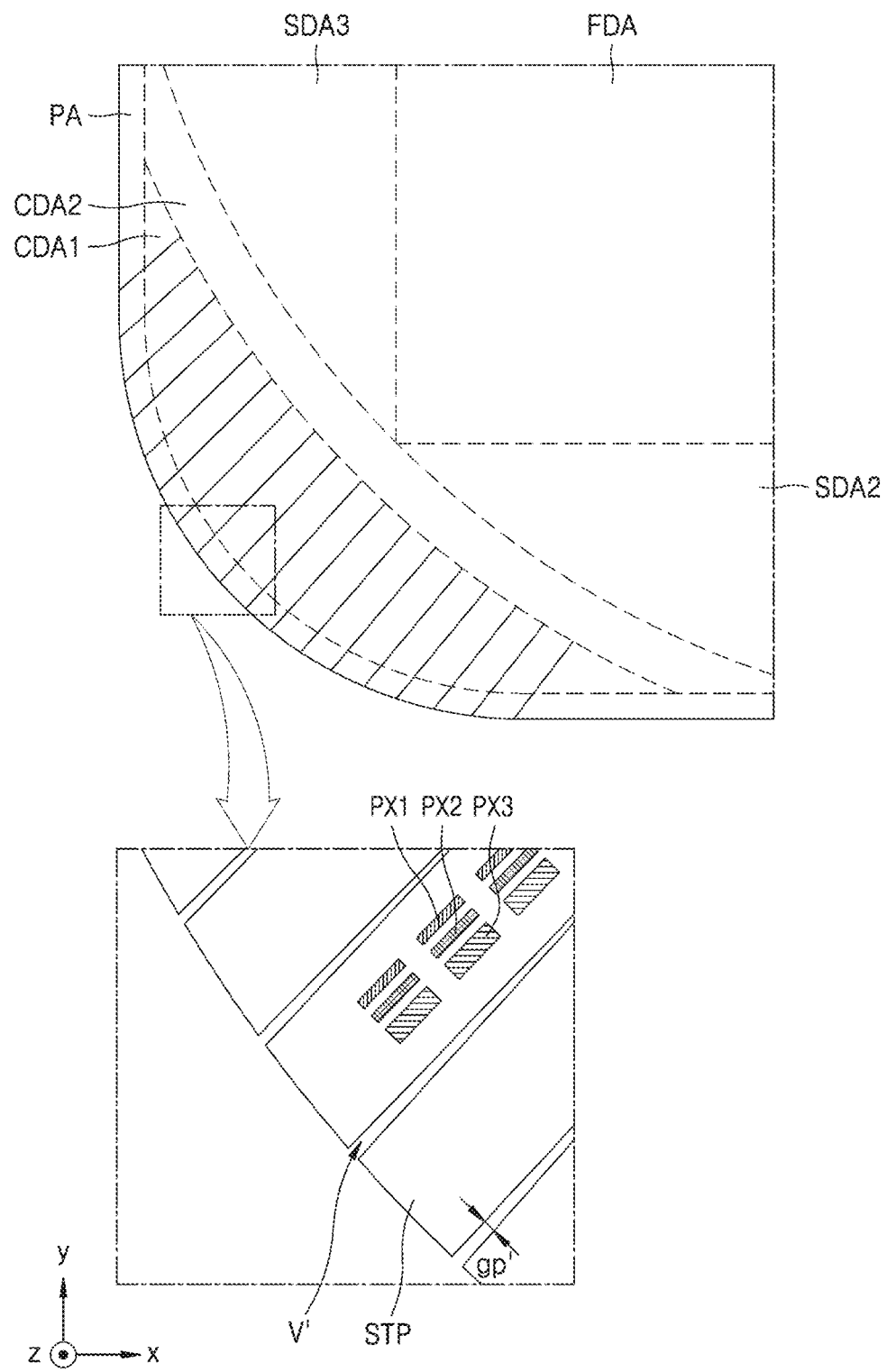

FIGS. 4A and 4B are enlarged plan views schematically illustrating a portion of a display panel according to an embodiment. Particularly, FIG. 4A may be in an unfolded state before an external force is applied to on the display panel, and FIG. 4B may be in a state in which deformation is formed after an external force is applied to the display panel.

Referring to FIG. 4A, the display panel 10 may include a plurality of strip portions STP arranged to correspond to the first corner display area CDA1, and a plurality of first through-portions V located between the plurality of strip portions STP and passing through the display panel 10. Because the display panel 10 includes the substrate 100, it may be said that the substrate 100 has the plurality of strip portions STP and the plurality of first through-portions V.

One end (i.e., outer end) of each of the plurality of strip portions STP may be arranged to be spaced apart from each other by a certain gap gp. Empty spaces may be defined between the plurality of strip portions STP by the gap gp, and the empty spaces may correspond to the plurality of first through-portions V, respectively. The gap gp between the plurality of strip portions STP may vary. For example, as illustrated in FIG. 4A, the gap gp between the plurality of strip portions STP may increase in a direction from the second corner display area CDA2 toward the first corner display area CDA1. As another example, the gap gp between the plurality of strip portions STP may be constant instead of variable. That is, the plurality of strips portions STP may be arranged radially or may be arranged in parallel to each other.

The other end (i.e., end contacting the second corner display area CDA2) of each of the plurality of strip portions STP may be connected to each other instead of being separated from each other. As illustrated in FIG. 4A, the plurality of strip portions STPs may be connected at a portion adjacent to the second corner display area CDA2. Also, the plurality of strip portions STPs may extend from the second corner display area CDA2 to the peripheral area PA and may define the plurality of first through-portions V located between the plurality of strip portions STPs. The extended lengths of the plurality of strip portions STP may be different from each other. The extended lengths of the plurality of strip portions STP may be different from each other depending on the distances of the strip portion STP from a central region of the first corner display area CDA1. For example, a strip portion STP located at the center thereof among the plurality of strip portions STP may have a greater length extending toward the peripheral area PA than the other strip portions STP, and the extended lengths of the plurality of strip portions STP may decrease as the distance of the strip portion STP from the central region of the first corner display area CDA1 increases as shown in FIG. 4A.

Each first through-portion V may pass through the front surface (i.e., display surface) and the bottom surface (i.e., rear surface) of the display panel 10. Each first through-portion V may reduce the weight of the display panel 10 and improve the flexibility of the display panel 10. Also, because the shape of the first through-portions V changes when an external force (e.g., bending, curving, or pulling) is applied to the display panel 10 or the plurality of strip portions STP are separated from each other by the first through-portions V, a stress generated when the display panel 10 is deformed may be easily reduced (stress applied to one strip portion STP is not transferred to other strip portions STP) and thus the abnormal deformation of the display panel 10 may be prevented and the durability thereof may be improved. Accordingly, the user's convenience in using an electronic apparatus including the display panel 10 may be improved, and the display panel 10 may be easily applied to a wearable apparatus.

Referring to FIG. 4B, when an external force is applied to the display panel 10, the area or shape of a first through-portion V' may be changed, and the position of a strip portion STP may also be changed. For example, when a force is applied to bend the edges of the display panel 10 and the corner side therebetween, as a gap gp' between the plurality of strip portions STP decreases, the area of the first through-portion V' may also decrease, and the adjacent strip portions STP may contact each other.

As such, when an external force is applied to the display panel 10, there may be a change in the gap gp' between two adjacent strip portions STP and the area of the first through-portion V', and there may be no change in the shape of the plurality of strip portions STP. That is, a pixel circuit and a light emitting device may be arranged on the plurality of strip portions STP, and the pixel circuit and the light emitting device arranged on the plurality of strip portions STP may be protected because the shape of the plurality of strip portions STP does not change even when an external force is applied to the display panel 10. Thus, pixels may also be arranged in the first corner display area CDA1 of the display panel 10 having a curvature. Accordingly, the display area DA may be expanded from the main display area MDA to the first corner display area CDA1.

First to third pixels PX1, PX2, and PX3 arranged on the strip portion STP may be spaced apart from each other in one direction. Although FIGS. 4A and 4B illustrate that the first to third pixels PX1, PX2, and PX3 are arranged in a stripe type, the disclosure according to the invention is not limited thereto, and the first to third pixels PX1, PX2, and PX3 may be arranged in various types such as an s-stripe type or a pentile type in another embodiment.

Figure 5A:
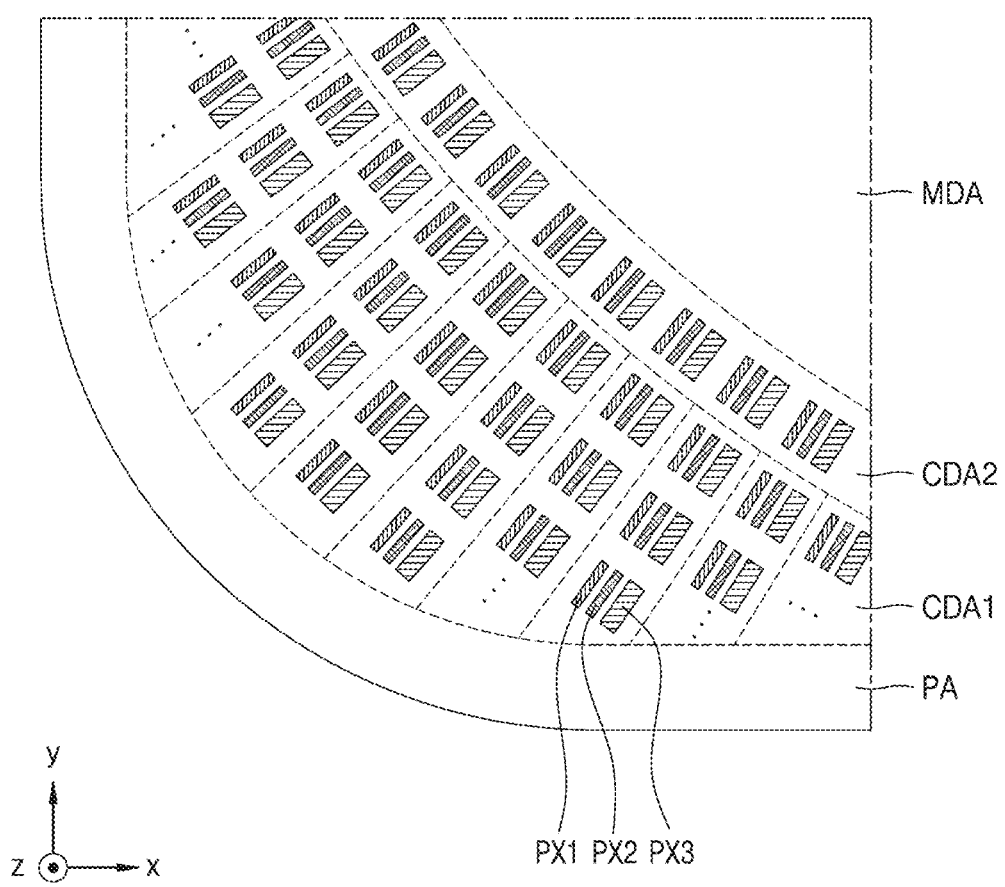
FIGS. 5A and 5B are enlarged plan views schematically illustrating a portion of a display panel according to an embodiment.
Figure 5B:
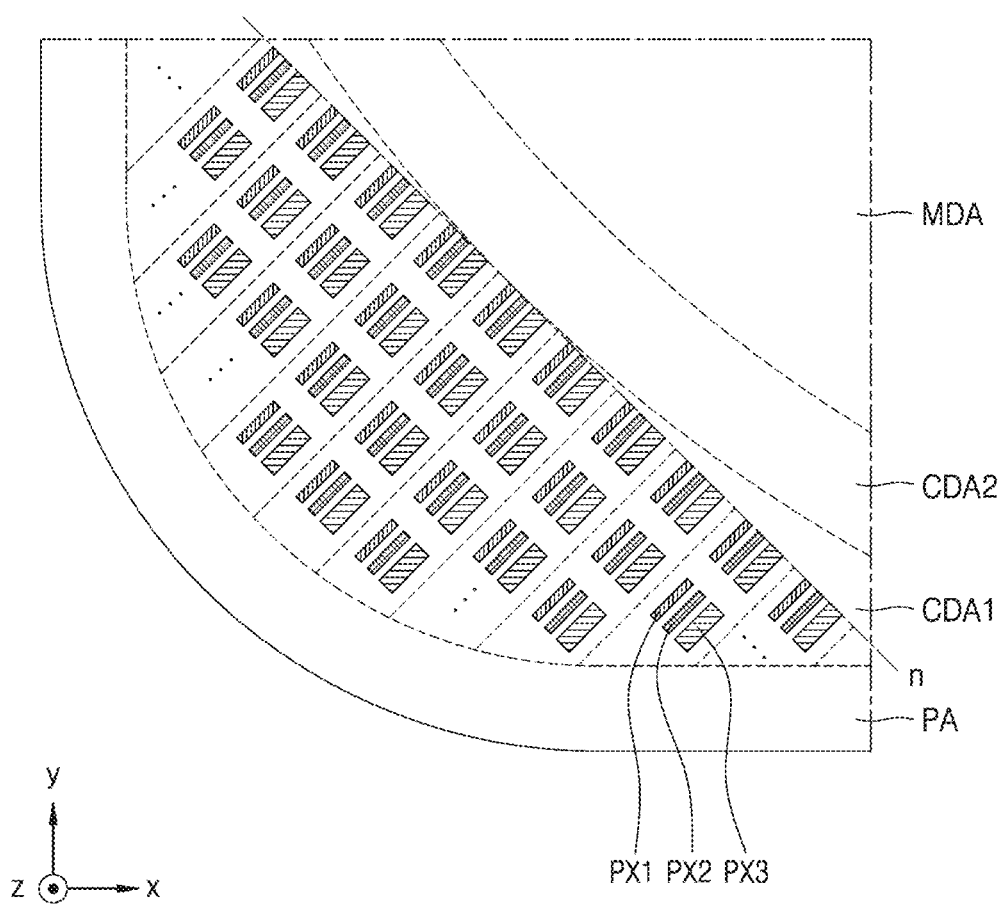

FIGS. 5A and 5B are enlarged plan views schematically illustrating a portion of a display panel according to an embodiment. FIGS. 5A and 5B illustrate the arrangement of pixels on a plane.

Referring to FIGS. 5A and 5B, in a plan view, the first corner display area CDA1 may be entirely or at least partially surrounded by the second corner display area CDA2 and the peripheral area PA. In a plan view, the boundary between the first corner display area CDA1 and the second corner display area CDA2 may include a curved line or a straight line. Hereinafter, for convenience of description, it will be assumed that, in a plan view, the first corner display area CDA1 is entirely surrounded by the second corner display area CDA2 and the peripheral area PA, and the boundary between the first corner display area CDA1 and the second corner display area CDA2 includes a curved line.

In an embodiment, as illustrated in FIG. 5A, the pixels in the first corner display area CDA1 (e.g., PX1, PX2, and PX3) may be arranged along the curved line of the boundary between the first and second corner display areas CDA1 and CDA2 and may be arranged in a direction perpendicular to the curved line. Thus, the pixels arranged in the first corner display area CDA1 may be arranged in a radial form.

In other embodiments, as illustrated in FIG. 5B, the pixels in the first corner display area CDA1 may be arranged along a virtual straight line "n" corresponding to a tangent line of the curved line of the boundary and may be arranged in a direction perpendicular to the tangent line. In this case, the distances between the pixels adjacent to each other in the first corner display area CDA1 may be the same. The arrangement of the pixels illustrated in FIGS. 5A and 5B is merely an example, and various other arrangements thereof may be possible.

The pixels PX1, PX2, and PX3 may also be arranged in the second corner display area CDA2 as the pixels PX1, PX2, and PX3 are arranged in the first corner display area CDA1. The arrangement of the pixels PX1, PX2, and PX3 in the first corner display area CDA1 and the arrangement of the pixels PX1, PX2, and PX3 in the second corner display area CDA2 may be the same. Accordingly, the boundary between the first corner display area CDA1 and the second corner display area CDA2 may be ambiguous, and the heterogeneity between the first corner display area CDA1 and the second corner display area CDA2 may be reduced.

Although FIGS. 5A and 5B illustrate that the pixels PX1, PX2, and PX3 are arranged in a stripe type, the pixels PX1, PX2, and PX3 may be arranged in various types such as an s-stripe type or a pentile type in another embodiment.

Figure 6A:
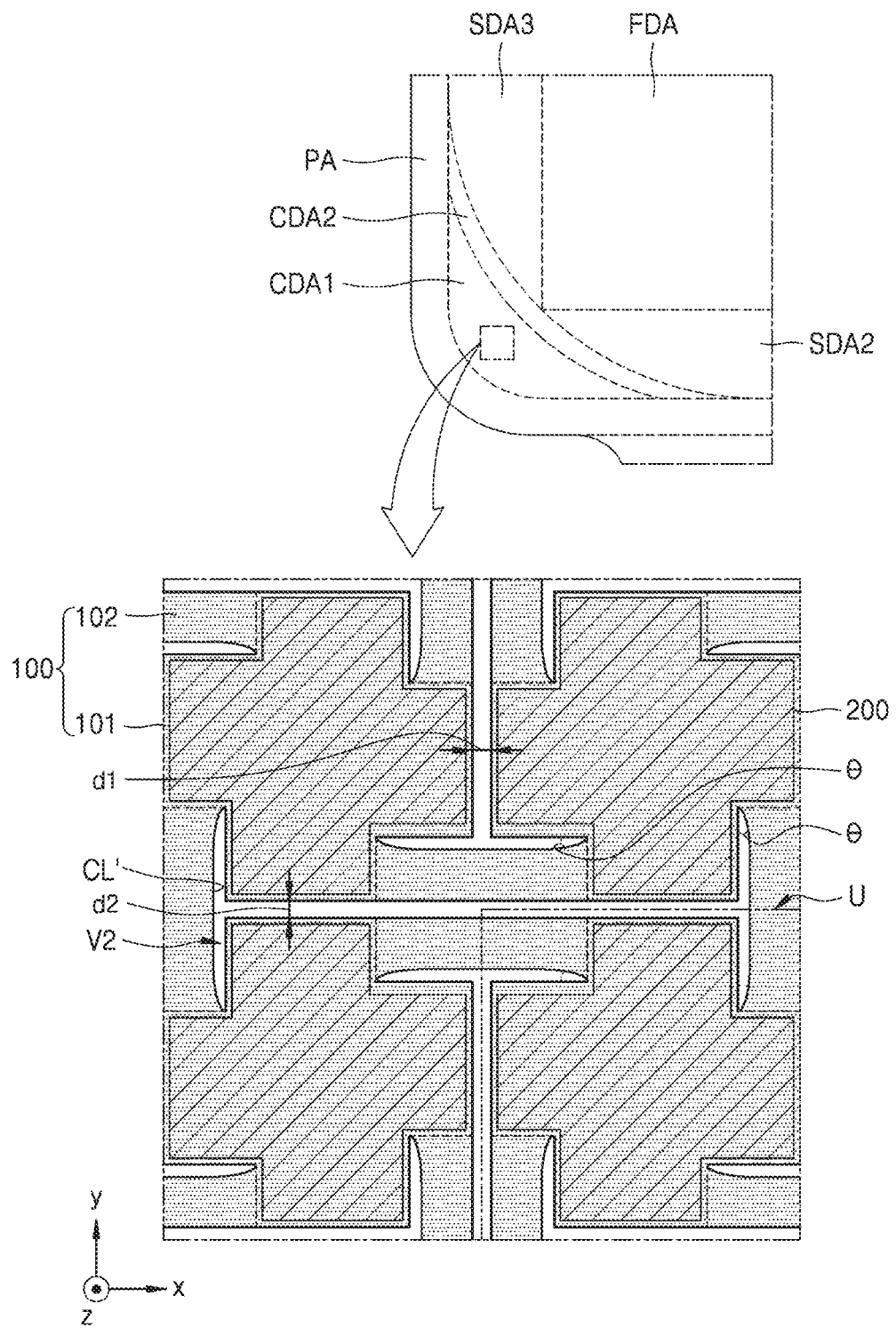
FIGS. 6A and 6B are enlarged plan views schematically illustrating a portion of a display panel according to another embodiment.
Figure 6B:
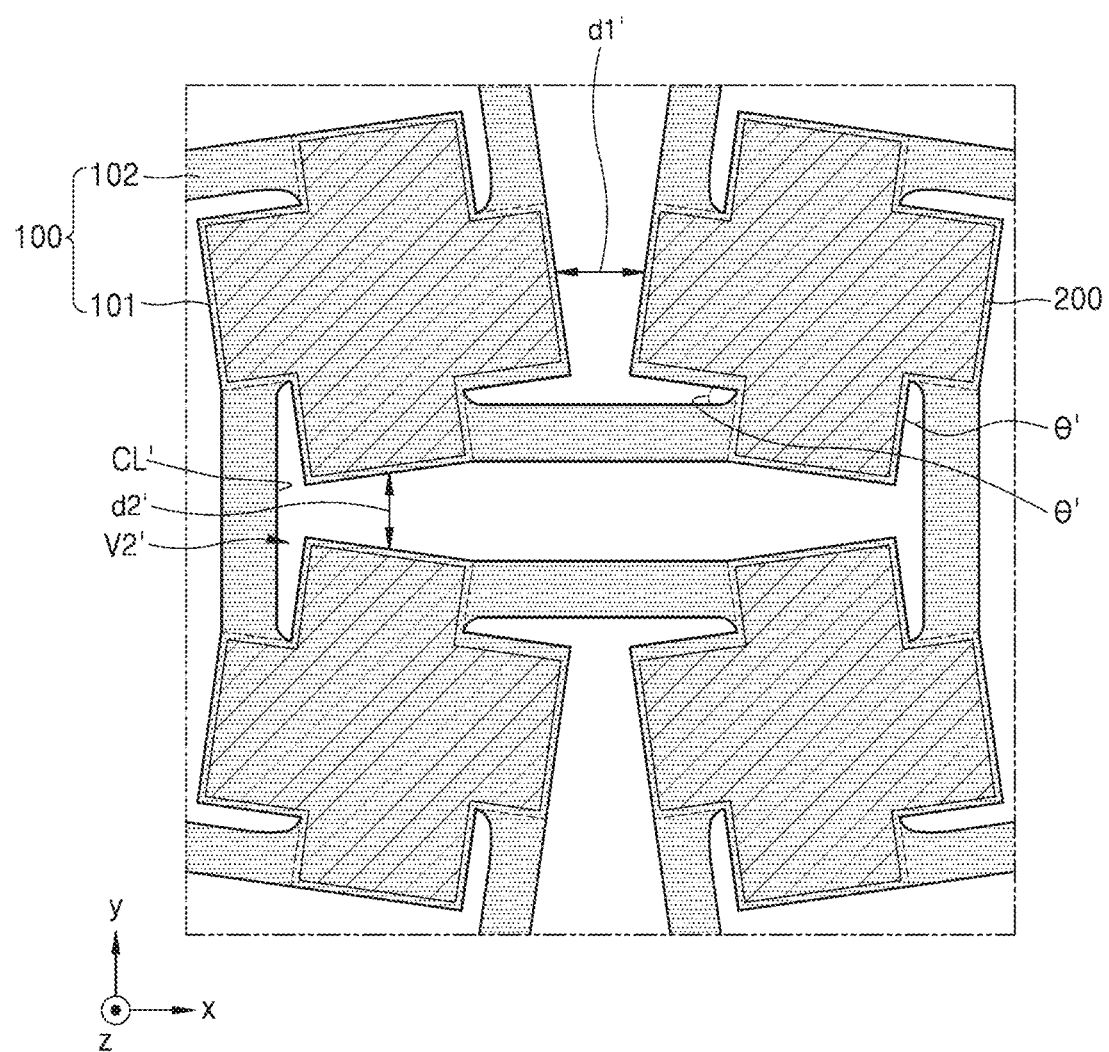

FIGS. 6A and 6B are enlarged plan views schematically illustrating a portion of a display panel according to another embodiment. Particularly, FIG. 6A may be in an unfolded state before an external force is applied to on the display panel, and FIG. 6B may be in a state in which deformation is occurred after an external force is applied to the display panel.

Referring to FIG. 6A, the first corner display area CDA1 of the display panel 10 may include a plurality of islands 101 spaced apart from each other, a plurality of connection portions 102 connecting the plurality of islands 101, and a plurality of second through-portions V2 located between the island 101 and the connection portion 102 and passing through the display panel 10. Because the display panel 10 includes the substrate 100, it may be said that the substrate 100 has the plurality of islands 101 and the plurality of connection portions 102, and the plurality of second through-portions V2 is defined in the substrate 100.

The plurality of islands 101 may be arranged to be spaced apart from each other. For example, the plurality of islands 101 may form a flat grid pattern that is repeatedly arranged in a first direction (e.g., the x direction) and a second direction (e.g., the y direction) different from the first direction. In an embodiment, the first direction and the second direction may be perpendicular to each other. In other embodiments, the first direction and the second direction may form an obtuse angle or an acute angle therebetween.

Each of the plurality of islands 101 may include a pixel region 200. The pixel region 200 may be a region in which a pixel circuit, a light emitting device, or the like may be arranged. As such, the light emitting device may be arranged in the pixel region 200, at least one pixel may be defined in the pixel region 200, and the pixel may include a display element that emits light in the visible wavelengths. For example, a red pixel, a green pixel, and a blue pixel may be arranged in each pixel region 200. Alternatively, a red pixel, a green pixel, a blue pixel, and a white pixel may be arranged on each pixel region 200.

The plurality of connection portions 102 may connect adjacent islands 101 to each other. For example, four connection portions 102 may be connected to each island 101. Four connection portions 102 connected to one island 101 may extend in different directions, and each connection portion 102 may be connected to another island 101 arranged adjacent to the one island 101 described above. For example, one island 101 may be connected through each of four connection portions 102 to four islands 101 arranged in directions surrounding the one island 101 described above.

The plurality of islands 101 and the plurality of connection portions 102 may be continuously formed of the same material. That is, the plurality of islands 101 and the plurality of connection portions 102 may be integrally formed.

Hereinafter, for convenience of description, one island 101 and connection portions 102 connected thereto will be referred to as one basic unit U, and the structure of the substrate 100 and the structure of the display apparatus will be described in more detail by using the same. The basic unit U may be repeatedly arranged in the first direction (e.g., x direction) and the second direction (e.g., y direction), and the substrate 100 may be formed by connecting the repeatedly-arranged basic units U to each other. Two basic units U adjacent to each other may be symmetrical to each other. For example, in FIG. 6A, two basic units U adjacent to each other in the horizontal direction (i.e., x direction) may be horizontally symmetrical with respect to a symmetry axis that is located therebetween and is parallel to the y direction. Similarly, in FIG. 6A, two basic units U adjacent to each other in the vertical direction (i.e., y direction) may be vertically symmetrical with respect to a symmetry axis that is located therebetween and is parallel to the x direction.

Among the plurality of basic units U, adjacent basic units U, for example, four basic units U illustrated in FIG. 6A, may form a closed curve CL' therebetween. Here, the closed curve CL' may define a second through-portion V2 that is an empty space. For example, the second through-portion V2 may be defined as a closed curve CL' formed by the edges of the plurality of islands 101 and the edges of adjacent connection portions 102 as shown in FIG. 6A.

Each second through-portion V2 may pass through the front surface and the bottom surface of the display panel 10. Each second through-portion V2 may provide a through-portion between the plurality of islands 101, reduce the weight of the display panel 10, and improve the flexibility of the display panel 10. Also, because the shape of the second through-portions V2 changes when an external force (e.g., bending, curving, or pulling) is applied to the display panel 10, a stress generated when the display panel 10 is deformed may be easily reduced and thus the abnormal deformation of the display panel 10 may be prevented and the durability thereof may be improved. Accordingly, the user's convenience in using an electronic apparatus including the display panel 10 may be improved, and the display panel 10 may be easily applied to a wearable apparatus.

An angle θ between the edge of an island 101 included in one basic unit U and the edge of an adjacent connection portion 102 may be an acute angle, and when an external force, such as a force of pulling the display panel 10, is applied, an angle θ' (θ'>θ) between the edge of the island 101 and the edge of the adjacent connection portion 102 may increase, the area or shape of the second through-portion V2' may be changed, and the position of the island 101 may also be changed, as illustrated in FIG. 6B. FIG. 6B is a plan view illustrating that the display panel 10 is stretched in the first direction and the second direction, and when the above force is applied, each island 101 may rotate at a certain angle by the change of the angle θ' and the increase of the area of the second through-portion V2' and/or the shape deformation thereof. The distance between the islands 101, for example, a first distance d1 and a second distance d2, may change to a first distance d1' and a second distance d2' due to the force above. The distance between the islands 101, for example, the first distance d1' and the second distance d2', may vary at each location by the rotation of each island 101.

When the force of pulling the display panel 10 is applied, because the stress may be concentrated on the connection portion 102 connected to the edge of the island 101, the closed curve CL' defining the second through-portion V2 may be changed to include a curved line in order to prevent damage to the display panel 10.

As described above, the display panel 10 corresponding to the first corner display area CDA1 may include a plurality of islands 101 and a plurality of connection portions 102 connecting the plurality of islands 101. The display panel 10 may also define a plurality of second through-portions V2 located between the plurality of connection portions 102 and passing through the display panel 10. Accordingly, the first corner display area CDA1 may be arranged between a plurality of areas having different curvature radiuses. That is, the curvature radius of the first corner display area CDA1 including the display panel 10 with improved flexibility may vary.

Figure 7:
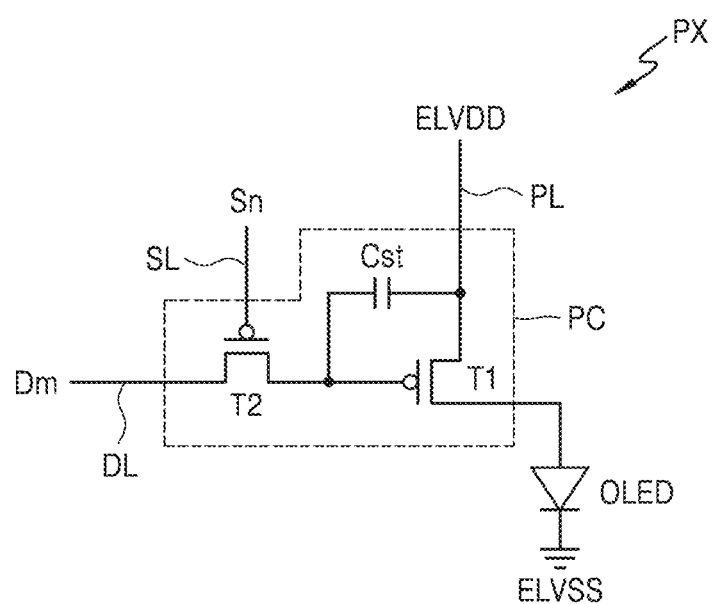
FIG. 7 is an equivalent circuit diagram schematically illustrating a pixel of a display panel according to an embodiment.

FIG. 7 is an equivalent circuit diagram schematically illustrating a pixel of a display panel according to an embodiment.

Referring to FIG. 7, each pixel PX may include a pixel circuit PC connected to a scan line SL and a data line DL and an organic light emitting diode OLED connected to the pixel circuit PC.

The pixel circuit PC may include a driving thin film transistor (driving "TFT") T1, a switching thin film transistor (switching TFT) T2, and a storage capacitor Cst. The switching thin film transistor T2 may be connected to the scan line SL and the data line DL and may be configured to transmit a data signal Dm input through the data line DL to the driving thin film transistor T1 according to a scan signal Sn input through the scan line SL.

The storage capacitor Cst may be connected to the switching thin film transistor T2 and a driving voltage line PL and may store a voltage corresponding to the difference between a voltage received from the switching thin film transistor T2 and a driving voltage ELVDD supplied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current.

Although FIG. 7 illustrates that the pixel circuit PC includes two thin film transistors and one storage capacitor, the disclosure according to the invention is not limited thereto. For example, the pixel circuit PC may include three or more thin film transistors and/or two or more storage capacitors in another embodiment. For example, the pixel circuit PC may include seven thin film transistors and one storage capacitor. This will be described in FIG. 8.

Figure 8:
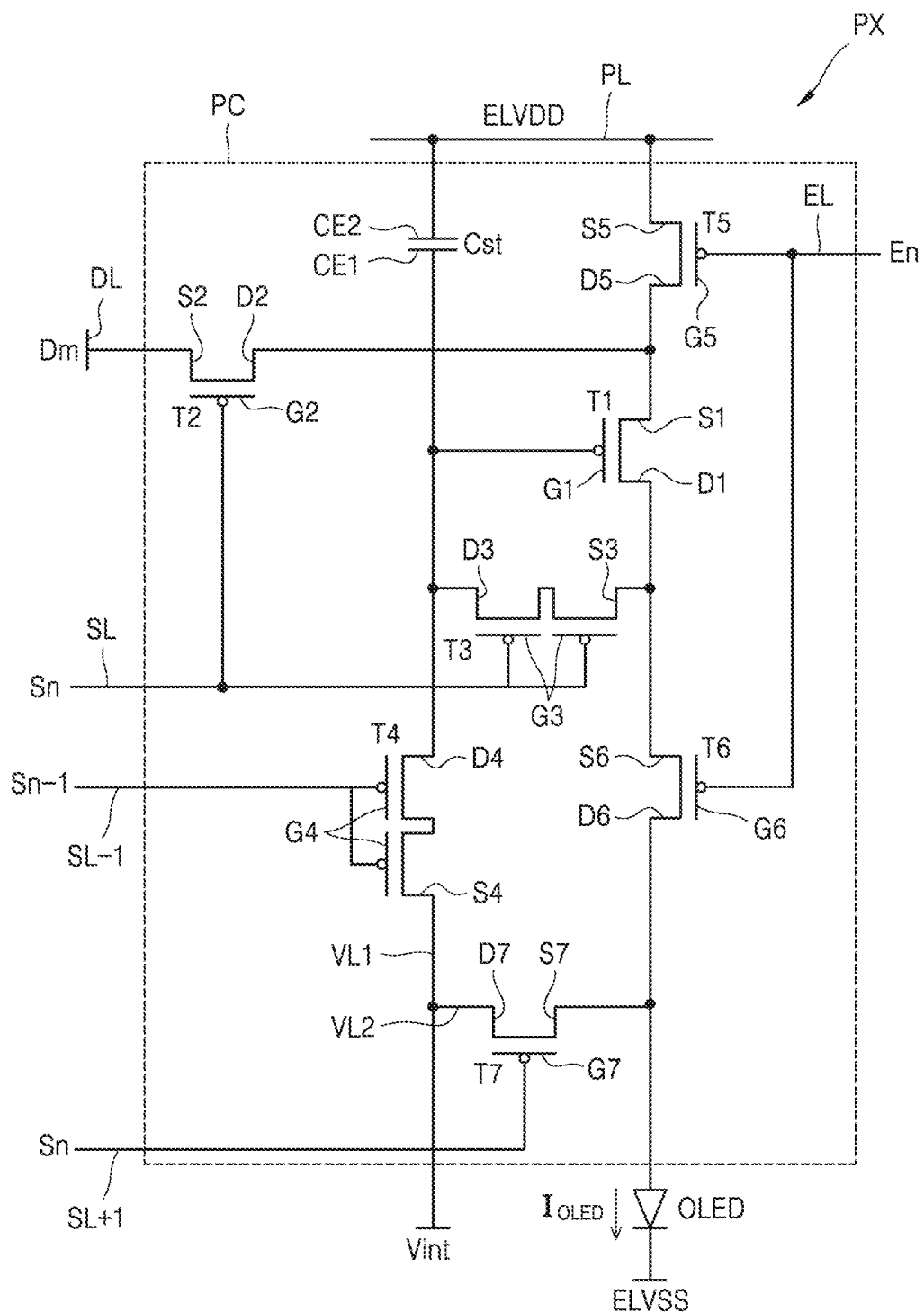
FIG. 8 is an equivalent circuit diagram schematically illustrating a pixel of a display panel according to an embodiment.

FIG. 8 is an equivalent circuit diagram schematically illustrating a pixel of a display panel according to an embodiment.

Referring to FIG. 8, a pixel PX may include a pixel circuit PC and an organic light emitting diode OLED connected to the pixel circuit PC.

For example, as illustrated in FIG. 8, the pixel circuit PC may include a plurality of thin film transistors T1 to T7 and a storage capacitor Cst. The thin film transistors T1 to T7 and the storage capacitor Cst may be connected to signal lines SL, SL−1, SL+1, EL, and DL, a first initialization voltage line VL1, a second initialization voltage line VL2, and a driving voltage line PL.

The signal lines SL, SL−1, SL+1, EL, and DL may include a scan line SL configured to transmit a scan signal Sn, a previous scan line SL−1 configured to transmit a previous scan signal Sn−1 to a first initialization thin film transistor T4, a next scan line SL+1 configured to transmit a scan signal Sn to a second initialization thin film transistor T7, an emission control line EL configured to transmit an emission control signal En to an operation control thin film transistor T5 and an emission control thin film transistor T6, and a data line DL intersecting with the scan line SL and configured to transmit a data signal Dm. The driving voltage line PL may be configured to transmit a driving voltage ELVDD to a driving thin film transistor T1, the first initialization voltage line VL1 may be configured to transmit an initialization voltage Vint to the first initialization thin film transistor T4, and the second initialization voltage line VL2 may be configured to transmit an initialization voltage Vint to the second initialization thin film transistor T7.

A driving gate electrode G1 of the driving thin film transistor T1 may be connected to a first electrode CE1 of the storage capacitor Cst, a driving source electrode S1 of the driving thin film transistor T1 may be connected to the driving voltage line PL via the operation control thin film transistor T5, and a driving drain electrode D1 of the driving thin film transistor T1 may be electrically connected to a pixel electrode of the organic light emitting diode OLED via the emission control thin film transistor T6. The driving thin film transistor T1 may receive the data signal Dm according to a switching operation of the switching thin film transistor T2 and supply a driving current $I_{OLED}$ to the organic light emitting diode OLED.

A switching gate electrode G2 of the switching thin film transistor T2 may be connected to the scan line SL, a switching source electrode S2 of the switching thin film transistor T2 may be connected to the data line DL, and a switching drain electrode D2 of the switching thin film transistor T2 may be connected to the driving source electrode S1 of the driving thin film transistor T1 and connected to the driving voltage line PL via the operation control thin film transistor T5. The switching thin film transistor T2 may be turned on according to the scan signal Sn received through the scan line SL, to perform a switching operation of transmitting the data signal Dm transmitted to the data line DL to the driving source electrode S1 of the driving thin film transistor T1.

A compensation gate electrode G3 of a compensation thin film transistor T3 may be connected to the scan line SL, a compensation source electrode S3 of the compensation thin film transistor T3 may be connected to the driving drain electrode D1 of the driving thin film transistor T1 and connected to the pixel electrode of the organic light emitting diode OLED via the emission control thin film transistor T6, and a compensation drain electrode D3 of the compensation thin film transistor T3 may be connected to the first electrode CE1 of the storage capacitor Cst, a first initialization drain electrode D4 of the first initialization thin film transistor T4, and the driving gate electrode G1 of the driving thin film transistor T1. The compensation thin film transistor T3 may be turned on according to the scan signal Sn received through the scan line SL, to electrically connect the driving gate electrode G1 and the driving drain electrode D1 of the driving thin film transistor T1 to diode-connect the driving thin film transistor T1.

A first initialization gate electrode G4 of the first initialization thin film transistor T4 may be connected to the previous scan line SL−1, a first initialization source electrode S4 of the first initialization thin film transistor T4 may be connected to the first initialization voltage line VL1, and the first initialization drain electrode D4 of the first initialization thin film transistor T4 may be connected to the first electrode CE1 of the storage capacitor Cst, the compensation drain electrode D3 of the compensation thin film transistor T3, and the driving gate electrode G1 of the driving thin film transistor T1. The first initialization thin film transistor T4 may be turned on according to the previous scan signal Sn−1 received through the previous scan line SL−1, to perform an initialization operation of initializing the voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be electrically connected to a second initialization source electrode S7 of the second initialization thin film transistor T7 and the pixel electrode of the organic light emitting diode OLED.

The operation control thin film transistor T5 and the emission control thin film transistor T6 may be simultaneously turned on according to the emission control signal En received through the emission control line EL, such that the driving current $I_{OLED}$ may flow through the organic light emitting diode OLED.

A second initialization gate electrode G7 of the second initialization thin film transistor T7 may be connected to the next scan line SL+1, and the second initialization source electrode S7 of the second initialization thin film transistor T7 may be connected to the emission control drain electrode D6 of the emission control thin film transistor T6 and the pixel electrode of the organic light emitting diode OLED, and a second initialization drain electrode D7 of the second initialization thin film transistor T7 may be connected to the second initialization voltage line VL2.

Moreover, because the scan line SL and the next scan line SL+1 are electrically connected to each other (not illustrated), the same scan signal Sn may be applied to the scan line SL and the next scan line SL+1. Thus, the second initialization thin film transistor T7 may be turned on according to the scan signal Sn received through the next scan line SL+1, to initialize the pixel electrode of the organic light emitting diode OLED.

A second electrode CE2 of the storage capacitor Cst may be connected to the driving voltage line PL, and a common electrode of the organic light emitting diode OLED may be connected to a common voltage ELVSS. Accordingly, the organic light emitting diode OLED may receive the driving current $I_{OLED}$ from the driving thin film transistor T1 to emit light to display an image.

Although FIG. 8 illustrates that the compensation thin film transistor T3 and the first initialization thin film transistor T4 have a dual gate electrode, the compensation thin film transistor T3 and the first initialization thin film transistor T4 may have a single gate electrode in another embodiment.

In the present embodiment, the plurality of thin film transistors T1 to T7 may include a semiconductor layer including silicon. For example, the plurality of thin film transistors T1 to T7 may include a semiconductor layer including low-temperature polysilicon ("LTPS"). The polysilicon material may have high electron mobility (over 100 square centimeters per voltage second: $cm^2/Vs$ or more) and thus may have low energy consumption and excellent reliability. As another example, the semiconductor layers of the plurality of thin film transistors T1 to T7 may include or be formed of amorphous silicon (a-Si), and some of the plurality of thin film transistors may include or be formed of low-temperature polysilicon (LTPS), and some other semiconductor layers may include or be formed of amorphous silicon (a-Si).

Also, in the present embodiment, the plurality of thin film transistors T1 to T7 may include a semiconductor layer including an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As another example, the semiconductor layers of the plurality of thin film transistors T1 to T7 may include or be formed of an oxide semiconductor material, and some semiconductor layers of the plurality of thin film transistors may include or be formed of amorphous silicon or polysilicon.

Figure 9A:
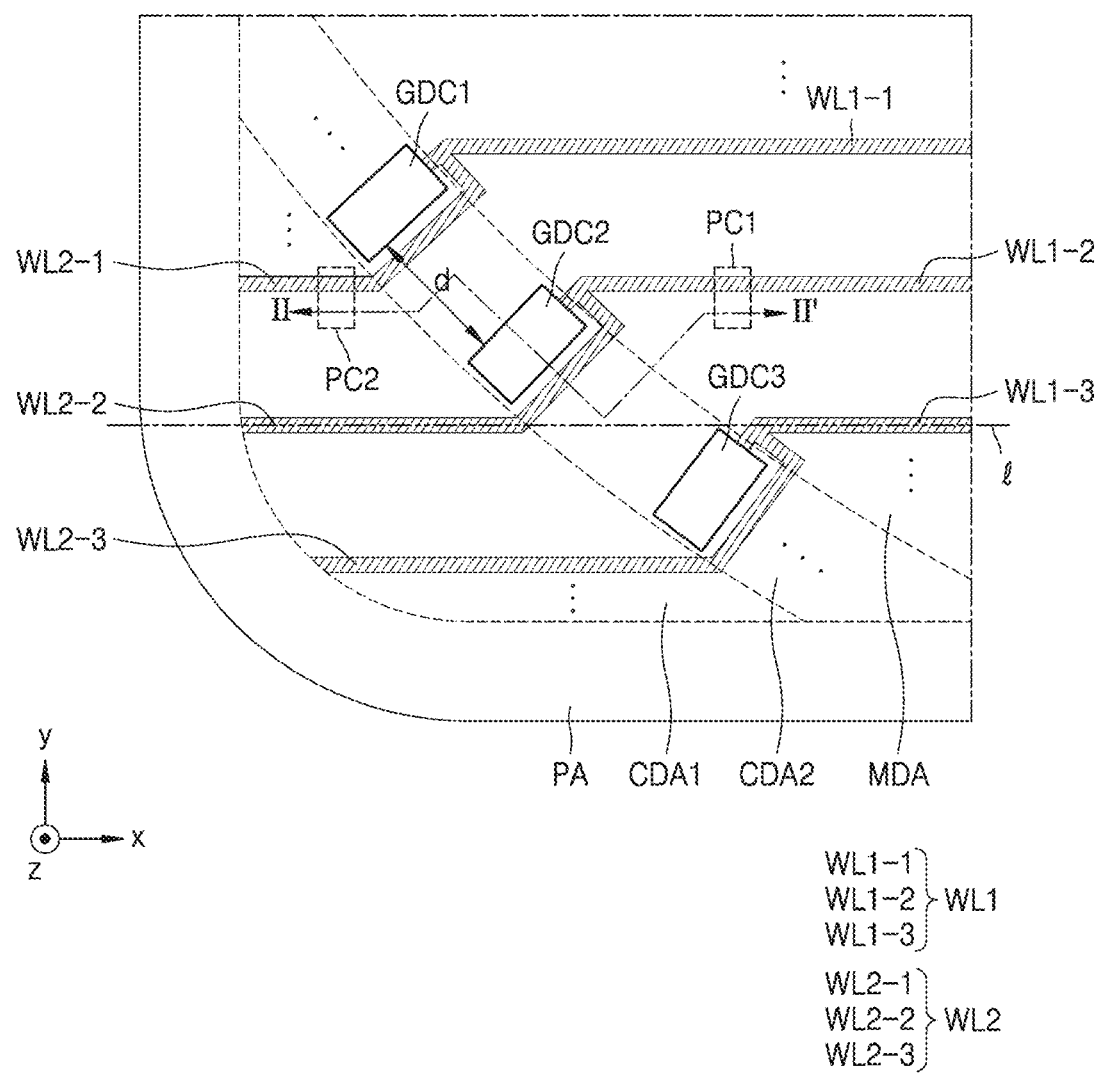
FIG. 9A is an enlarged plan view schematically illustrating a portion of FIG. 3.
Figure 9B:
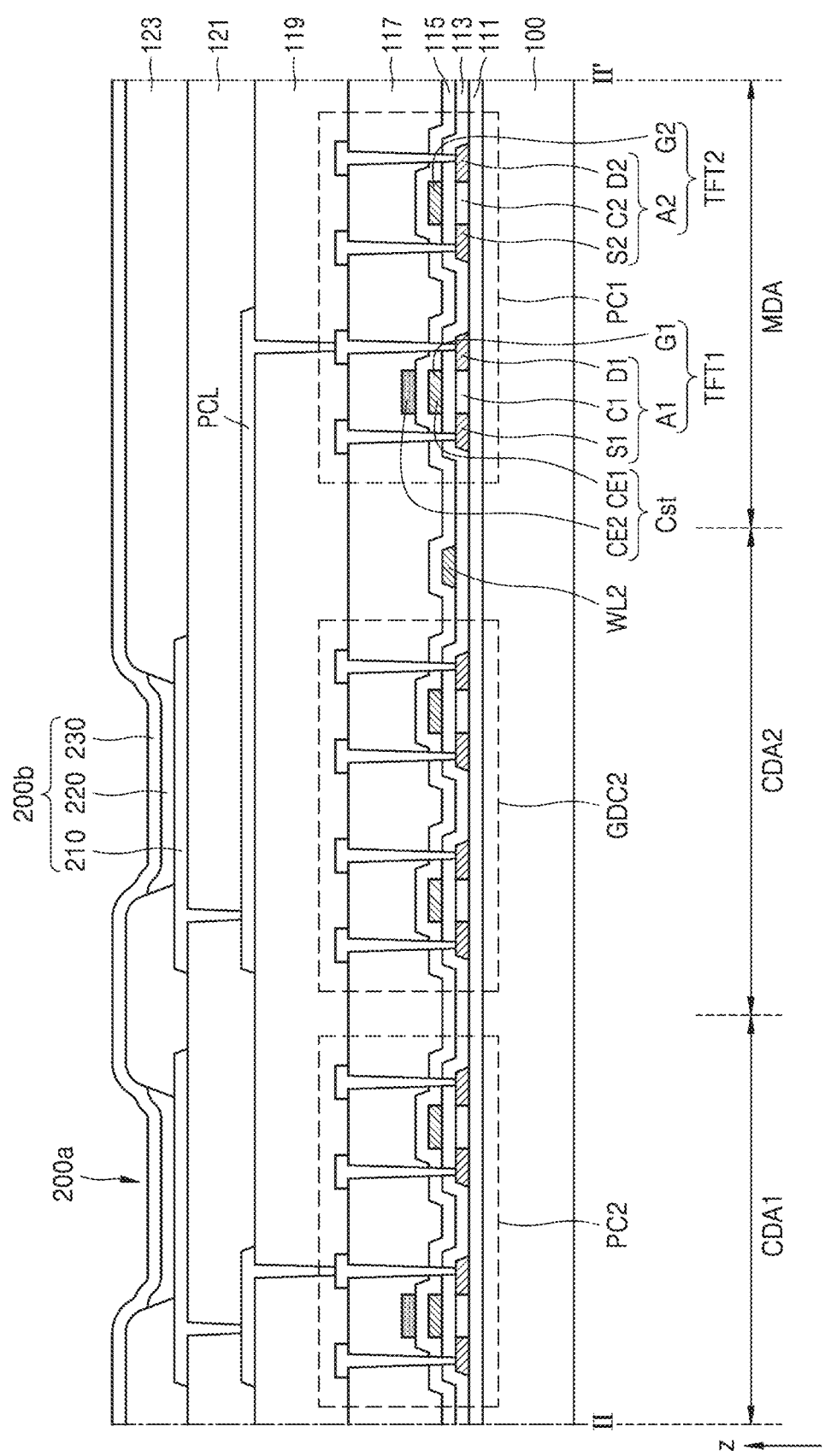
FIG. 9B is a cross-sectional view of a display panel according to an embodiment, which corresponds to a cross-section taken along line II-II' of FIG. 9A.

FIG. 9A is an enlarged plan view schematically illustrating a portion of FIG. 3, and FIG. 9B is a cross-sectional view of a display panel according to an embodiment, which corresponds to a cross-section taken along line II-II' of FIG. 9A. Particularly, FIG. 9A corresponds to an enlargement of a partial corner portion of the display panel.

Referring to FIG. 9A, the display panel 10 may include a main display area MDA, a second corner display area CDA2 extending from a corner of the main display area MDA, and a first corner display area CDA1 between a peripheral area PA and the second corner display area CDA2 and curved with a preset curvature radius.

A first gate driving circuit GDC1, a second gate driving circuit GDC2, and a third gate driving circuit GDC3 may be arranged in the second corner display area CDA2. The first gate driving circuit GDC1, the second gate driving circuit GDC2, and the third gate driving circuit GDC3 may be arranged to be spaced apart from each other. For example, the first gate driving circuit GDC1 and the second gate driving circuit GDC2 may be arranged to be spaced apart from each other by a separation distance d. For example, the separation distanced may be about 10 micrometers (μm) to about 30 μm.

The first gate driving circuit GDC1 may include a scan driving circuit and an emission control driving circuit and may provide a scan signal and an emission control signal to each pixel PX electrically connected to the first gate driving circuit GDC1 (see FIG. 1). Although the first gate driving circuit GDC1 has been described as a reference, the second gate driving circuit GDC2 and the third gate driving circuit GDC3 may also be similarly applied. Although FIG. 9A illustrates three gate driving circuits, more gate driving circuits may be arranged.

The display panel 10 may include a plurality of first lines WL1 connected to the first gate driving circuit GDC1, the second gate driving circuit GDC2, and the third gate driving circuit GDC3, respectively. The plurality of first lines WL1 may extend toward the main display area MDA. That is, in a state where the display panel 10 is unfolded, the plurality of first lines WL1 may extend from the gate driving circuits in the +x direction.

Also, the display panel 10 may include a plurality of second lines WL2 connected to the first gate driving circuit GDC1, the second gate driving circuit GDC2, and the third gate driving circuit GDC3, respectively. The plurality of second lines WL2 may be integrally formed with the plurality of first lines WL1 and may include the same material as the plurality of first lines WL1. The plurality of second lines WL2 may pass through the space in the second corner display area CDA2 generated when the first gate driving circuit GDC1, the second gate driving circuit GDC2, and the third gate driving circuit GDC3 are arranged to be spaced apart from each other. Also, the plurality of second lines WL2 may extend toward the first corner display area CDA1. That is, in a state where the display panel 10 is unfolded, the plurality of second lines WL2 may extend from the gate driving circuits in the −x direction.

As illustrated in FIG. 9A, a $(1\text{-}1)^{st}$ line WL1-1 among the plurality of first lines WL1 may be connected to a $(2\text{-}1)^{st}$ line WL2-1 among the plurality of second lines WL2, a $(1\text{-}2)^{nd}$ line WL1-2 among the plurality of first lines WL1 may be connected to a $(2\text{-}2)^{nd}$ line WL2-2 among the plurality of second lines WL2, and a $(1\text{-}3)^{rd}$ line WL1-3 among the plurality of first lines WL1 may be connected to a $(2\text{-}3)^{rd}$ line WL2-3 among the plurality of second lines WL2. Also, in a state in which the display panel 10 is unfolded, a virtual extending line of the $(2\text{-}1)^{st}$ line WL2-1 may be on the same line as the $(1\text{-}2)^{nd}$ line WL1-2. Similarly, a virtual extending line of the $(2\text{-}2)^{nd}$ line WL2-2 may be on the same line as the $(1\text{-}3)^{rd}$ line WL1-3. That is, as illustrated in FIG. 9A, a virtual straight line $\ell$ including the $(2\text{-}2)^{nd}$ line WL2-2 and the $(1\text{-}3)^{rd}$ line WL1-3 may exist and be parallel to the x direction.

Because the first lines WL1 (i.e., $(1\text{-}1)^{st}$ line WL1-1, $(1\text{-}2)^{nd}$ line WL1-2, and $(1\text{-}3)^{rd}$ line WL1-3) are connected to the first gate driving circuit GDC1, the second gate driving circuit GDC2, and the third gate driving circuit GDC3, respectively, and the second lines WL2 (i.e., $(2\text{-}1)^{st}$ line WL2-1, $(2\text{-}2)^{nd}$ line WL2-2, and $(2\text{-}3)^{rd}$ line WL2-3) are connected to the first gate driving circuit GDC1, the second gate driving circuit GDC2, and the third gate driving circuit GDC3, respectively, the plurality of first lines WL1 and the plurality of second lines WL2 may be the scan line SL (see FIG. 8) or the emission control line EL (see FIG. 8). Also, because the plurality of first lines WL1 and the plurality of second lines WL2 extend in the x direction in a state where the display panel 10 is unfolded, the plurality of first lines WL1 and the plurality of second lines WL2 may be referred to as horizontal lines in the present specification.

A first pixel circuit PC1 including one of the plurality of first lines WL1 may be arranged in the main display area MDA, and a second pixel circuit PC2 including one of the plurality of second lines WL2 may be arranged in the first corner display area CDA1. Each of the first pixel circuit PC1 and the second pixel circuit PC2 may include seven thin film transistors and one storage capacitor as described above with reference to FIG. 8.

Hereinafter, with reference to FIG. 9B, a thin film transistor, a storage capacitor, a light emitting device, and lines constituting a display panel will be described in more detail in the stack order thereof, and the positional relationship of the gate driving circuit, the plurality of first lines WL1, the plurality of second lines WL2, and the like will be described.

The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayer structure including an inorganic layer (not illustrated) and a layer including the above polymer resin.

The buffer layer 111 may reduce or block the penetration of foreign materials, moisture, or external air from the bottom of the substrate 100 and may provide a flat surface on the substrate 100. The buffer layer 111 may include an inorganic material such as oxide or nitride, an organic material, or an organic/inorganic composite and may include a single-layer or multi-layer structure of an inorganic material and an organic material.

A barrier layer (not illustrated) may be further included between the substrate 110 and the buffer layer 111. The barrier layer may prevent or minimize the penetration of impurities from the first substrate 110 or the like into a first semiconductor layer A1. The barrier layer may include an inorganic material such as oxide or nitride, an organic material, or an organic/inorganic composite and may include a single-layer or multi-layer structure of an inorganic material and an organic material.

The first semiconductor layer A1 may be arranged on the buffer layer 111. The first semiconductor layer A1 may include amorphous silicon or may include polysilicon. In other embodiments, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The first semiconductor layer A1 may include a first channel region C1 and a first source region S1 and a first drain region D1 arranged on both sides of the first channel region C1. The first semiconductor layer A1 may include a single layer or a multiple layer. Although the first semiconductor layer A1 has been described as a reference, a second semiconductor layer A2 may also be similarly applied. The second semiconductor layer A2 may include a second channel region C2 and a second source region S2 and a second drain region D2 arranged on both sides of the second channel region C2, and the second semiconductor layer A2 may include amorphous silicon, polysilicon, and/or oxide.

A first gate insulating layer 113 and a second gate insulating layer 115 may be stacked and arranged on the substrate 100 to cover the first semiconductor layer A1 and the second semiconductor layer A2. The first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

On the first gate insulating layer 113, a first gate electrode G1 may be arranged to at least partially overlap the first semiconductor layer A1 and a second gate electrode G2 may be arranged to at least partially overlap the second semiconductor layer A2. FIG. 9B illustrates that the first gate electrode G1 and the second gate electrode G2 are arranged on the first gate insulating layer 113; however, in other embodiments, the first gate electrode G1 and the second gate electrode G2 may be arranged on the upper surface of the second gate insulating layer 115. Also, a plurality of first lines WL1 and a plurality of second lines WL2 may be arranged on the first gate insulating layer 113. FIG. 9B illustrates that the second line WL2 is arranged on the first gate insulating layer 113; however, in other embodiments, the plurality of first lines WL1 and the plurality of second lines WL2 may be arranged on the upper surface of the second gate insulating layer 115. The first gate electrode G1, the second gate electrode G2, the plurality of first lines WL1, and the plurality of second lines WL2 may include a single layer or a multiple layer formed of or including a metal of at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In an embodiment, a storage capacitor Cst may include a first electrode CE1 and a second electrode CE2 and may overlap a first thin film transistor TFT1 in a plan view as illustrated in FIG. 9B. For example, the first gate electrode G1 of the first thin film transistor TFT1 may function as the first electrode CE1 of the storage capacitor Cst. In another embodiment, the storage capacitor Cst may exist separately instead of overlapping the first thin film transistor TFT1.

The second electrode CE2 of the storage capacitor Cst may overlap the first electrode CE1 with the second gate insulating layer 115 therebetween and may form a capacitance. In this case, the second gate insulating layer 115 may function as a dielectric layer of the storage capacitor Cst.

An interlayer-insulating layer 117 may be arranged on the second gate insulating layer 115 to cover the second electrode CE2 of the storage capacitor Cst. The interlayer-insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). Also, the interlayer-insulating layer 117 may include an organic material. For example, the interlayer-insulating layer 117 may include a general-purpose polymer such as benzocyclobutene ("BCB"), polyimide, hexamethyldisiloxane ("HM DSO"), polymethylmethacrylate ("PMMA"), or polystyrene ("PS"), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

A source electrode, a drain electrode, a data line, and the like may be arranged on the interlayer-insulating layer 117.

The source electrode, the drain electrode, and the data line may include a conductive material including molybdenum (Mo), aluminum (Al), copper (Cu), titanium (Ti), or the like and may include a single layer or a multiple layer including the above material. For example, the source electrode, the drain electrode, and the data line may include a multilayer structure of Ti/Al/Ti. The source electrode and the drain electrode may be connected to the first source region S1 and the first drain region D1 of the first semiconductor layer A1 through contact holes, respectively. Although the first semiconductor layer A1 has been described as a reference, the second semiconductor layer A2 may also be similarly applied.

The source electrode, the drain electrode, and the data line may be covered with an inorganic protection layer (not illustrated). The inorganic protection layer may include a single layer or a multiple layer of silicon nitride ($SiN_x$) and silicon oxide ($SiO_x$). The inorganic protection layer may be introduced to cover and protect some lines arranged on the interlayer-insulating layer 117.

A first planarization layer 119 and a second planarization layer 121 may be sequentially arranged to cover the source electrode, the drain electrode, and the data line, and the first planarization layer 119 and the second planarization layer 121 may define contact holes for connecting the first thin film transistor TFT1 and the pixel electrode 210.

The first planarization layer 119 and the second planarization layer 121 may have a single layer or a multiple layer including an organic material and may provide a flat upper surface. The first planarization layer 119 and the second planarization layer 121 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

A pixel electrode connection line PCL may be arranged on the first planarization layer 119. The pixel electrode connection line PCL may be connected to the first thin film transistor TFT1 through the contact hole defined in the first planarization layer 119. The pixel electrode connection line PCL may extend toward the second corner display area CDA2 from the main display area MDA. That is, at least a portion of the pixel electrode connection line PCL may overlap the second gate driving circuit GDC2 and main display area MDA.

A first corner light emitting device 200a and a second corner light emitting device 200b may be arranged on the second planarization layer 121. The first corner light emitting device 200a and the second corner light emitting device 200b may each include a pixel electrode 210, an intermediate layer 220 including an organic light emitting layer, and an opposite electrode 230.

As illustrated in FIG. 9B, the first corner light emitting device 200a may be arranged in the first corner display area CDA1 and may be driven by the second pixel circuit PC2 arranged in the first corner display area CDA1. The second corner light emitting device 200b may be arranged in the second corner display area CDA2 but may be driven by the first pixel circuit PC1 arranged in the main display area MDA. That is, the pixel electrode 210 of the second corner light emitting device 200b may be connected to the first pixel circuit PC1 by the pixel electrode connection line PCL extending toward the second corner display area CDA2. FIG. 9B illustrates that the second corner light emitting device 200b is connected to the first pixel circuit PC1 arranged in the main display area MDA; however, in other embodiments, the second corner light emitting device 200b may be connected to the second pixel circuit PC2 arranged in the first corner display area CDA1.

The pixel electrode 210 may be a (semi)transparent electrode or a reflective electrode. In some embodiments, the pixel electrode 210 may include a reflective layer formed of Ag, Mg, Al, Pt, Pd, Au, Ni, Nd, Ir, Cr, or any compound thereof and a transparent or semitransparent electrode layer disposed on the reflective layer. The transparent or semitransparent electrode layer may include at least one selected from the group consisting of indium tin oxide ("ITO"), indium zinc oxide ("IZO"), zinc oxide (ZnO), indium oxide ($In_2O_3$), indium gallium oxide ("IGO"), and aluminum zinc oxide (AZO). In some embodiments, the pixel electrode 210 may include the structure ITO/Ag/ITO.

A pixel definition layer 123 may be arranged on the second planarization layer 121. Also, the pixel definition layer 123 may be arranged between the pixel electrode 210 and the opposite electrode 230 to increase the distance between the edge of the pixel electrode 210 and the opposite electrode 230 over the pixel electrode 210 to prevent an arc or the like from occurring at the edge of the pixel electrode 210.

The pixel definition layer 123 may include an organic insulating material of at least one selected from the group consisting of polyimide, polyamide, acrylic resin, benzocyclobutene, and phenol resin.

The intermediate layer 220 may be arranged in an opening defined by the pixel definition layer 123 and may include an organic emission layer. The organic emission layer may include an organic material including a fluorescent or phosphorescent material emitting red, green, blue, or white light. The organic emission layer may include a low molecular weight organic material or a high molecular weight organic material. Functional layers such as a hole transport layer ("HTL"), a hole injection layer ("HIL"), an electron transport layer ("ETL"), and an electron injection layer ("EIL") may optionally be further included under and/or over the organic emission layer.

The opposite electrode 230 may be a transparent electrode or a reflective electrode. In some embodiments, the opposite electrode 230 may be a transparent or semitransparent electrode and may include a thin metal layer having a low work function and including Li, Ca, LiF/Ca, LiF/Al, Al, Ag, Mg, or any compound thereof. Also, a transparent conductive oxide ("TCO") layer such as ITO, IZO, ZnO, or $In_2O_3$ may be further arranged on the thin metal layer. The opposite electrode 230 may be arranged across the display area DA and may be arranged over the intermediate layer 220 and the pixel definition layer 123. The opposite electrode 230 may be integrally formed to cover a plurality of organic light emitting diodes OLED to correspond to a plurality of pixel electrodes 210.

Because the organic light emitting device may be easily damaged by moisture or oxygen from the outside, an encapsulation layer (not illustrated) may cover and protect the organic light emitting device to protect. The encapsulation layer may include a first inorganic encapsulation layer, an organic encapsulation layer, and/or a second inorganic encapsulation layer.

The display panel 10 according to an embodiment may include a first corner display area CDA1 and a second corner display area CDA2, which extend from a corner of the main display area MDA. A plurality of gate driving circuits may be arranged in the second corner display area CDA2, and a plurality of first lines WL1 and a plurality of second lines WL2 may be connected to the plurality of gate driving circuits. In this case, the plurality of first lines WL1 may extend toward the main display area MDA, and the plurality of second lines WL2 may extend toward the first corner display area CDA1. Accordingly, pixel circuits PC2 including a plurality of second lines WL2 extending toward the first corner display area CDA1 may be arranged in the first corner display area CDA1. That is, because the second lines WL2 corresponding to the plurality of first lines WL1 arranged in the main display area MDA may also be arranged to extend into the first corner display area CDA1, the pixel circuit PC may also be arranged in the first corner display area CDA1. Since light emitting devices driven by the pixel circuits PC2 may be arranged in the first corner display area CDA1, the first corner display area CDA1 may display an image. Thus, the display area DA of the display panel 10 may increase by the amount of the first corner display area CDA1 from the main display area MDA.

Also, a plurality of gate driving circuits (e.g., GDC1, GDC2, GDC3 . . . ) may be arranged in the second corner display area CDA2 between the main display area MDA and the first corner display area CDA1; however, light emitting devices may be arranged to overlap the plurality of gate driving circuits. That is, as described above, light emitting devices may be arranged in the second corner display area CDA2, and the light emitting devices may be connected through the pixel electrode connection line PCL to the pixel circuits PC arranged in the main display area MDA or the first corner display area CDA1. Thus, the second corner display area CDA2 may also display an image, and the image may be displayed seamlessly from the main display area MDA to the first corner display area CDA1.

Figure 10A:
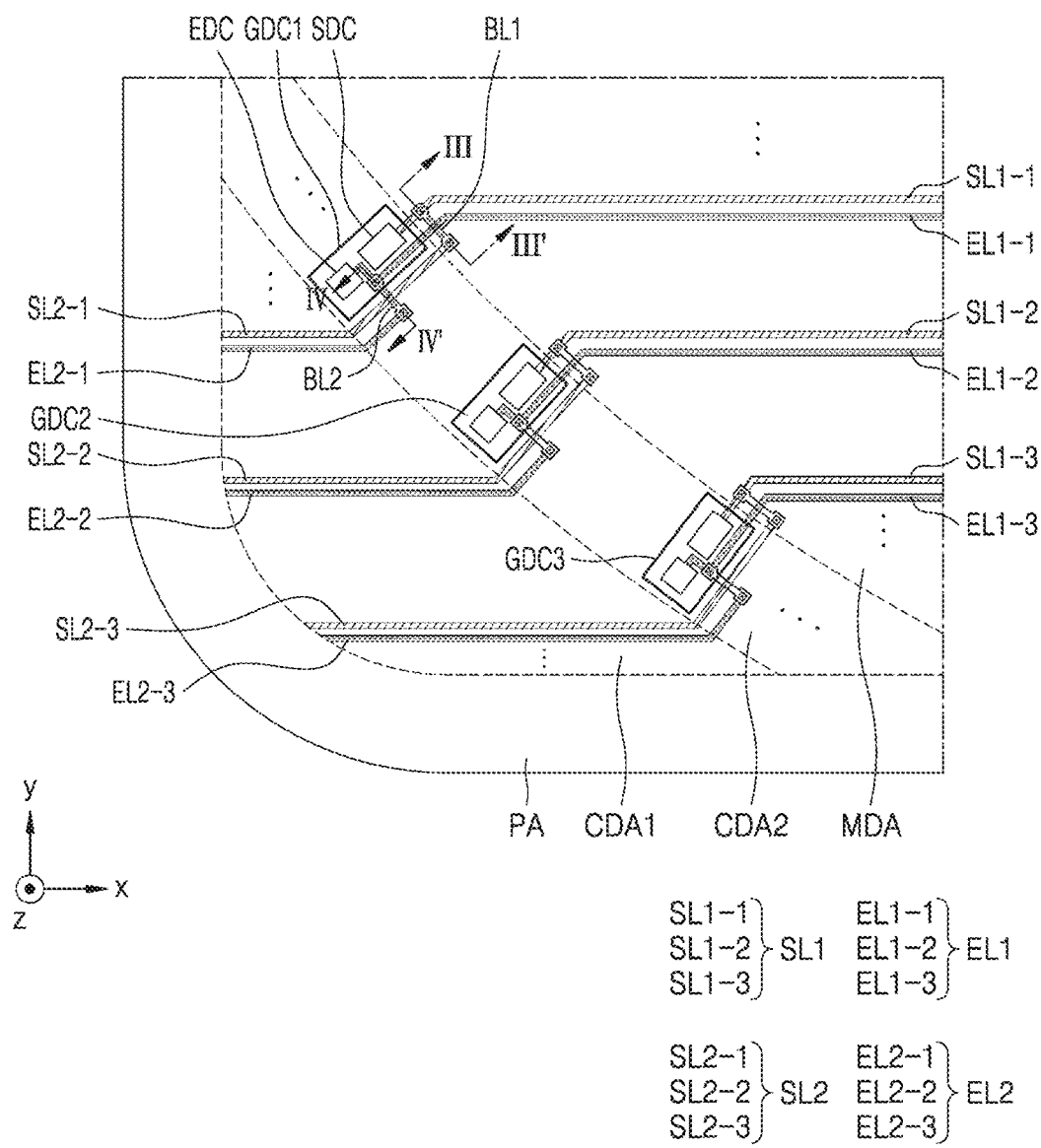
FIG. 10A is an enlarged plan view schematically illustrating a portion of FIG. 3.
Figure 10B:
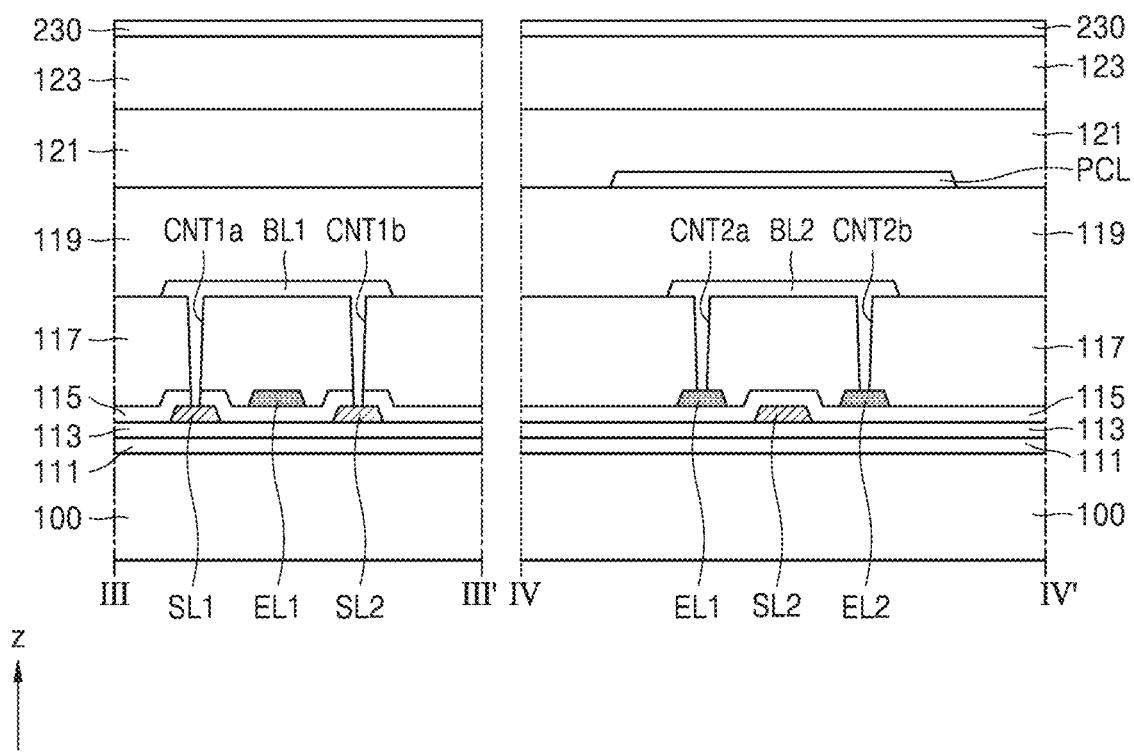
FIG. 10B is a cross-sectional view of a display panel according to an embodiment, which corresponds to a cross-section taken along line III-III' and line IV-IV' of FIG. 10A.

FIG. 10A is an enlarged plan view schematically illustrating a portion of FIG. 3, and FIG. 10B is a cross-sectional view of a display panel according to an embodiment, which corresponds to a cross-section taken along line III-III' and line IV-IV' of FIG. 10A. In FIGS. 10A and 10B, like reference numerals as those in FIGS. 9A and 9B denote like members and thus redundant descriptions thereof will be omitted for conciseness.

Referring to FIG. 10A, the display panel 10 may include a main display area MDA, a second corner display area CDA2 extending from a corner of the main display area MDA, and a first corner display area CDA1 between the peripheral area PA and the second corner display area CDA2 and curved with a preset curvature radius.

A first gate driving circuit GDC1, a second gate driving circuit GDC2, and a third gate driving circuit GDC3 may be arranged in the second corner display area CDA2. The first gate driving circuit GDC1, the second gate driving circuit GDC2, and the third gate driving circuit GDC3 may be arranged to be spaced apart from each other. The first gate driving circuit GDC1 may include a scan driving circuit SDC and an emission control driving circuit EDC and may provide a scan signal and an emission control signal to the pixels PX electrically connected to the first gate driving circuit GDC1 (see FIG. 1). Although the first gate driving circuit GDC1 has been described as a reference, the second gate driving circuit GDC2 and the third gate driving circuit GDC3 may also be similarly applied. Although FIG. 10A illustrates three gate driving circuits, more gate driving circuits may be arranged.

The display panel 10 may include a plurality of first scan lines SL1 connected to the first gate driving circuit GDC1, the second gate driving circuit GDC2, and the third gate driving circuit GDC3, respectively. To be precise, the plurality of first scan lines SL1 may be connected to the scan driving circuit SDC. The plurality of first scan lines SL1 may extend toward the main display area MDA. That is, in a state where the display panel 10 is unfolded, the plurality of first scan lines SL1 may extend from the second corner display area CDA2 in the +x direction.

Also, the display panel 10 may include a plurality of second scan lines SL2 connected to the first gate driving circuit GDC1, the second gate driving circuit GDC2, and the third gate driving circuit GDC3, respectively. However, each of the plurality of second scan lines SL2 may be connected to the scan driving circuit SDC through a first bridge line BL1 instead of being directly connected to the scan driving circuit SDC like the plurality of first scan lines SL1. The plurality of second scan lines SL2 may include the same material as the plurality of first scan lines SL1. Also, the plurality of second scan lines SL2 may extend toward the first corner display area CDA1. That is, in a state where the display panel 10 is unfolded, the plurality of second scan lines SL2 may extend from the second corner display area CDA2 in the −x direction.

As illustrated in FIG. 10A, a $(1\text{-}1)^{st}$ scan line SL1-1 among the plurality of first scan lines SL1 may be connected to a $(2\text{-}1)^{st}$ scan line SL2-1 among the plurality of second scan lines SL2 through the first bridge line BL1, a $(1\text{-}2)^{nd}$ scan line SL1-2 among the plurality of first scan lines SL1 may be connected to a $(2\text{-}2)^{nd}$ scan line SL2-2 among the plurality of second scan lines SL2, and a $(1\text{-}3)^{rd}$ scan line SL1-3 among the plurality of first scan lines SL1 may be connected to a $(2\text{-}3)^{rd}$ scan line SL2-3 among the plurality of second scan lines SL2. Also, in a state in which the display panel 10 is unfolded, a virtual extending line of the $(2\text{-}1)^{st}$ scan line SL2-1 may be on the same line as the $(1\text{-}2)^{nd}$ scan line SL1-2. Similarly, a virtual extending line of the $(2\text{-}2)^{nd}$ scan line SL2-2 may be on the same line as the $(1\text{-}3)^{rd}$ scan line SL1-3. That is, as described above with reference to FIG. 9A, a virtual straight line including the $(2\text{-}2)^{nd}$ scan line SL2-2 and the $(1\text{-}3)^{rd}$ scan line SL1-3 may exist and be parallel to the x direction.

The display panel 10 may include a plurality of first emission control lines EL1 connected to the first gate driving circuit GDC1, the second gate driving circuit GDC2, and the third gate driving circuit GDC3, respectively. To be precise, the plurality of first emission control lines EL1 may be connected to the emission control driving circuit EDC. The plurality of first emission control lines EL1 may extend toward the main display area MDA. That is, in a state where the display panel 10 is unfolded, the plurality of first emission control lines EL1 may extend from the second corner display area CDA2 in the +x direction.

Also, the display panel 10 may include a plurality of second emission control lines EL2 connected to the first gate driving circuit GDC1, the second gate driving circuit GDC2, and the third gate driving circuit GDC3, respectively. However, each of the plurality of second emission control lines EL2 may be connected to the emission control driving circuit EDC through a second bridge line BL2 instead of being directly connected to the emission control driving circuit EDC like the plurality of first emission control lines EL1. The plurality of second emission control lines EL2 may include the same material as the plurality of first emission control lines EL1. Also, the plurality of second emission control lines EL2 may extend toward the first corner display area CDA1. That is, in a state where the display panel 10 is unfolded, the plurality of second emission control lines EL2 may extend from the second corner display area CDA2 in the −x direction.

As illustrated in FIG. 10A, a $(1\text{-}1)^{st}$ emission control line EL1-1 among the plurality of first emission control lines EL1 may be connected to a $(2\text{-}1)^{st}$ emission control line EL2-1 among the plurality of second emission control lines EL2 through the second bridge line BL2, a $(1\text{-}2)^{nd}$ emission control line EL1-2 among the plurality of first emission control lines EL1 may be connected to a $(2\text{-}2)^{nd}$ emission control line EL2-2 among the plurality of second emission control lines EL2, and a $(1\text{-}3)^{rd}$ emission control line EL1-3 among the plurality of first emission control lines EL1 may be connected to a $(2\text{-}3)^{rd}$ emission control line EL2-3 among the plurality of second emission control lines EL2. Also, in a state in which the display panel 10 is unfolded, a virtual extending line of the $(2\text{-}1)^{st}$ emission control line EL2-1 may be on the same line as the $(1\text{-}2)^{nd}$ emission control line EL1-2. Similarly, a virtual extending line of the $(2\text{-}2)^{nd}$ emission control line EL2-2 may be on the same line as the $(1\text{-}3)^{rd}$ emission control line EL1-3. That is, as described above with reference to FIG. 9A, a virtual straight line including the $(2\text{-}2)^{nd}$ emission control line EL2-2 and the $(1\text{-}3)^{rd}$ emission control line EL1-3 may exist and be parallel to the x direction.

Referring to FIG. 10B, the arrangement form of the first bridge line BL1 connecting the first scan line SL1 and the second scan line SL2 and the arrangement form of the second bridge line BL2 connecting the first emission control line EL1 and the second emission control line EL2 may be seen in detail.

The first bridge line BL1 and the second bridge line BL2 may be arranged on the interlayer-insulating layer 117. One side of the first bridge line BL1 may contact the first scan line SL1 through a $(1\text{-}1)^{st}$ contact hole CNT1$a$, and the other side of the first bridge line BL1 may contact the second scan line SL2 through a $(1\text{-}2)^{nd}$ contact hole CNT1$b$. Also, one side of the second bridge line BL2 may contact the first emission control line EL1 through a $(2\text{-}1)^{st}$ contact hole CNT2$a$, and the other side of the second bridge line BL2 may contact the second emission control line EL2 through a $(2\text{-}2)^{nd}$ contact hole CNT2$b$.

FIGS. 10A and 10B illustrate that the first bridge line BL1 is arranged on a different layer than the first scan line SL1 and the second scan line SL2; however, as another example, the first bridge line BL1 may be arranged in the same layer as the first scan line SL1 and the second scan line SL2. That is, the first bridge line BL1 may be integrally formed with the first scan line SL1 and the second scan line SL2. Although the first bridge line BL1 has been described as a reference, the second bridge line BL2 may also be similarly applied.

As in the display panel 10 according to an embodiment, when the plurality of second scan lines SL2 and the plurality of second emission control lines EL2 extend toward the first corner display area CDA1, pixel circuits PC may also be arranged in the first corner display area CDA1. Light emitting devices driven by the pixel circuits PC may be arranged in the first corner display area CDA1, and the first corner display area CDA1 may display an image. Thus, the display area of the display panel 10 may increase by the amount of the first corner display area CDA1 in addition to the main display area MDA.

Figure 11A:
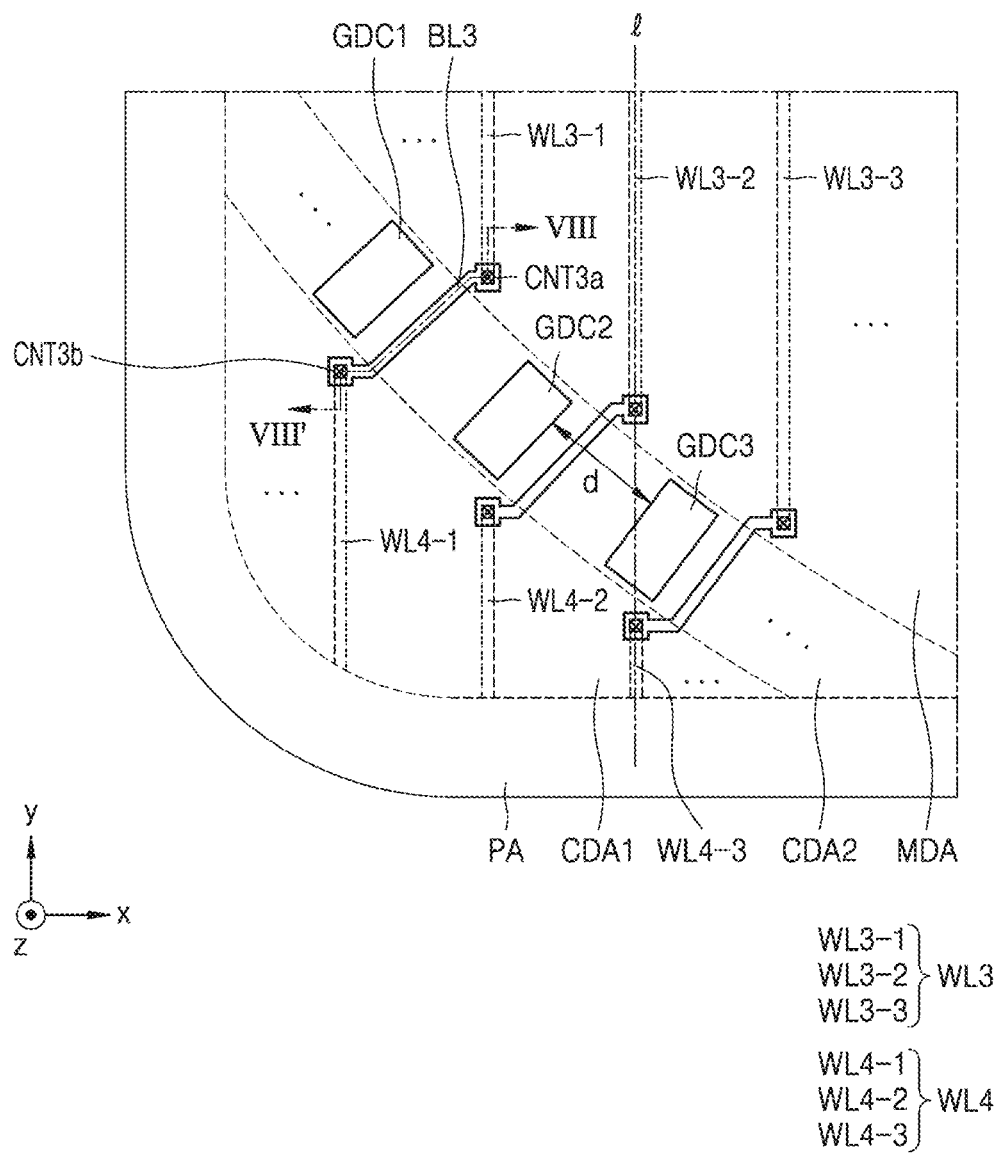
FIG. 11A is an enlarged plan view schematically illustrating a portion of FIG. 3.
Figure 11B:
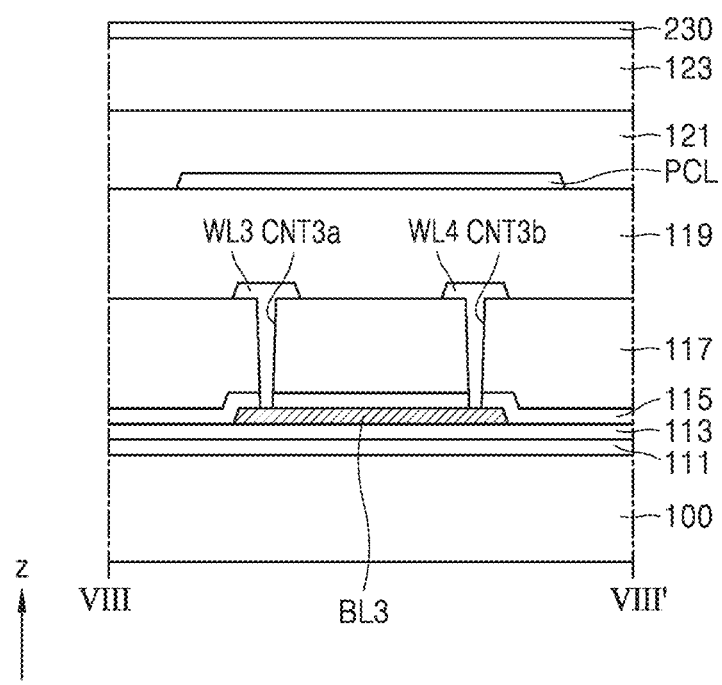
FIG. 11B is a cross-sectional view of a display panel according to an embodiment, which corresponds to a cross-section taken along line VIII-VIII' of FIG. 11A.

FIG. 11A is an enlarged plan view schematically illustrating a portion of FIG. 3, and FIG. 11B is a cross-sectional view of a display apparatus according to an embodiment, which corresponds to a cross-section taken along line VIII-VIII' of FIG. 11A. In FIGS. 11A and 11B, like reference numerals as those in FIGS. 9A and 9B denote like members and thus redundant descriptions thereof will be omitted for conciseness.

Referring to FIG. 11A, the display panel 10 may include a main display area MDA, a second corner display area CDA2 extending from a corner of the main display area MDA, and a first corner display area CDA1 between the peripheral area PA and the second corner display area CDA2 and curved with a preset curvature radius.

A first gate driving circuit GDC1, a second gate driving circuit GDC2, and a third gate driving circuit GDC3 may be arranged in the second corner display area CDA2. The first gate driving circuit GDC1, the second gate driving circuit GDC2, and the third gate driving circuit GDC3 may be arranged to be spaced apart from each other. For example, the second gate driving circuit GDC2 and the third gate driving circuit GDC3 may be arranged to be spaced apart from each other by a separation distance d.

The display panel 10 may include a plurality of third lines WL3 and a plurality of fourth lines WL4. The plurality of third lines WL3 may extend in the main display area MDA and may receive a signal supplied from the driving chip 20 by the connection lines CL as described above with reference to FIG. 3. The plurality of fourth lines WL4 may extend in the first corner display area CDA1. That is, in a state where the display panel 10 is unfolded, the plurality of third lines WL3 may extend in the +y direction and the plurality of fourth lines WL4 may extend in the −y direction.

The plurality of third lines WL3 and the plurality of fourth lines WL4 may be connected through a plurality of third bridge lines BL3, respectively. The plurality of third bridge lines BL3 may be respectively arranged in the spaces generated between the gate driving circuits when the first gate driving circuit GDC1, the second gate driving circuit GDC2, and the third gate driving circuit GDC3 are arranged to be spaced apart from each other. That is, the plurality of third bridge lines BL3 may be arranged between the first gate driving circuit GDC1, the second gate driving circuit GDC2, and the third gate driving circuit GDC3, respectively.

As illustrated in FIG. 11A, a $(3\text{-}1)^{st}$ line WL3-1 among the plurality of third lines WL3 may be connected to a $(4\text{-}1)^{st}$ line WL4-1 among the plurality of fourth lines WL4, a $(3\text{-}2)^{nd}$ line WL3-2 among the plurality of third lines WL3 may be connected to a $(4-2)^{nd}$ line WL4-2 among the plurality of fourth lines WL4, and a $(3-3)^{rd}$ line WL3-3 among the plurality of third lines WL3 may be connected to a $(4-3)^{rd}$ line WL4-3 among the plurality of fourth lines WL4. Also, in a state in which the display panel 10 is unfolded, a virtual extending line of the $(3-1)^{st}$ line WL3-1 may be on the same line as the $(4-2)^{nd}$ line WL4-2. Similarly, a virtual extending line of the $(3-2)^{nd}$ line WL3-2 may be on the same line as the $(4-3)^{rd}$ line WL4-3. That is, a virtual straight line $\ell$ including the $(3-2)^{nd}$ line WL3-2 and the $(4-3)^{rd}$ line WL4-3 may exist and be parallel to the y direction.

The plurality of third lines WL3 and the plurality of fourth lines WL4 may be any one of the data line DL (see FIG. 8) and the driving voltage line PL (see FIG. 8). Also, because the plurality of third lines WL3 and the plurality of fourth lines WL4 extend in the y direction in a state where the display panel 10 is unfolded, the plurality of third lines WL3 and the plurality of fourth lines WL4 may be referred to as vertical lines in the present specification.

Referring to FIG. 11B, the arrangement form of the third bridge line BL3 connecting the third line WL3 and the fourth line WL4 may be seen in detail.

The third bridge line BL3 may be arranged on the first gate insulating layer 113. One side of the third bridge line BL3 may contact the third line WL3 through a $(3-1)^{st}$ contact hole CNT3a, and the other side of the third bridge line BL3 may contact the fourth line WL4 through a $(3-2)^{nd}$ contact hole CNT3b.

As in the display panel 10 according to an embodiment, when the plurality of fourth lines WL4 extend toward the first corner display area CDA1, pixel circuits PC may also be arranged in the first corner display area CDA1. Light emitting devices driven by the pixel circuits PC may be arranged in the first corner display area CDA1, and the first corner display area CDA1 may display an image. Thus, the display area of the display panel 10 may increase by the amount of the first corner display area CDA1 besides the main display area MDA.

Figure 12A:
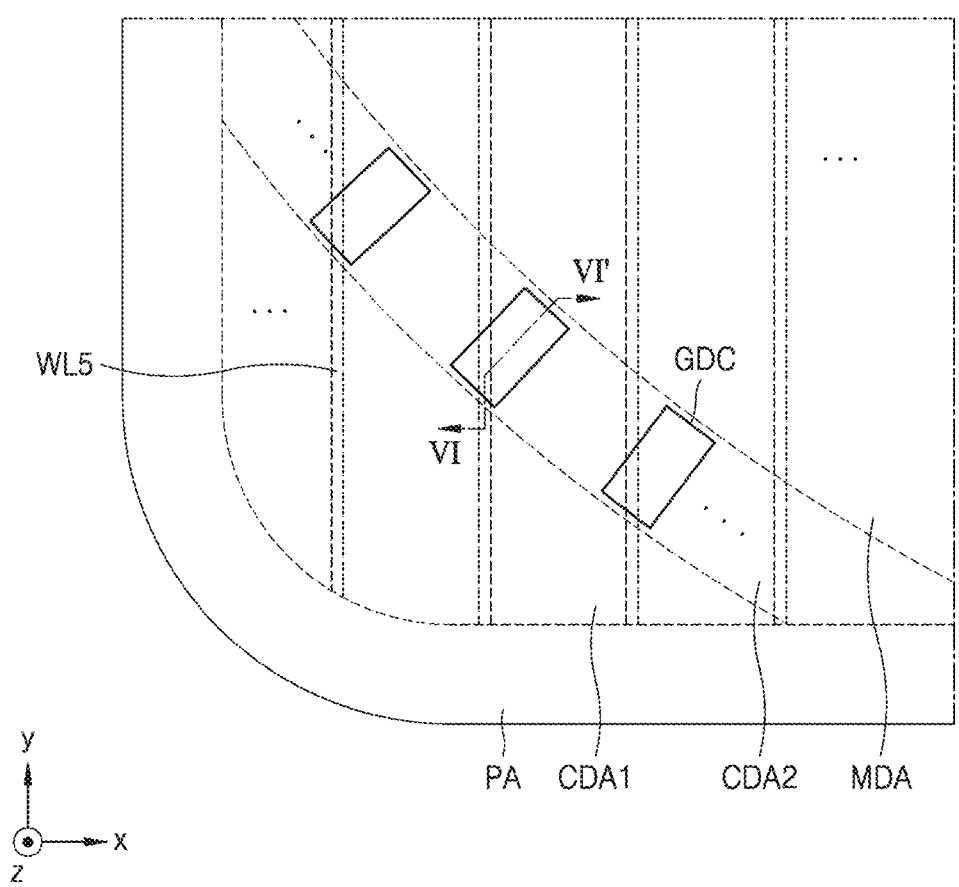
FIG. 12A is an enlarged plan view schematically illustrating a portion of FIG. 3.
Figure 12B:
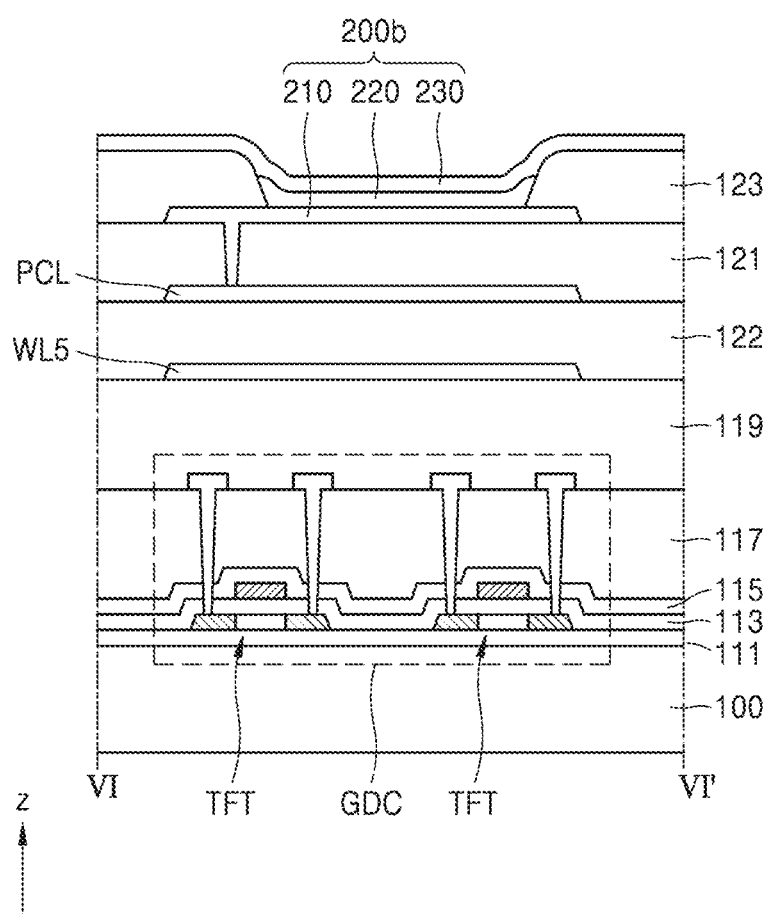
FIG. 12B is a cross-sectional view of a display panel according to an embodiment, which corresponds to a cross-section taken along line VI-VI' of FIG. 12A.

FIG. 12A is an enlarged plan view schematically illustrating a portion of FIG. 3, and FIG. 12B is a cross-sectional view of a display apparatus according to an embodiment, which corresponds to a cross-section taken along line VI-VI' of FIG. 12A. FIGS. 12A and 12B correspond to a modified embodiment of FIGS. 11A and 11B, and thus, it will be described below based on the difference from FIGS. 11A and 11B. In FIGS. 12A and 12B, like reference numerals as those in FIGS. 9A and 9B denote like members and thus redundant descriptions thereof will be omitted for conciseness.

Referring to FIG. 12A, the display panel 10 may include a plurality of fifth lines WL5. Unlike in FIG. 11A, the plurality of fifth lines WL5 may be arranged to extend in the y direction without using a bridge line. That is, the plurality of fifth lines WL5 may be arranged across the main display area MDA, the first corner display area CDA1, and the second corner display area CDA2.

Referring to FIG. 12B, the arrangement form of the plurality of fifth lines WL5 may be seen in detail.

A third planarization layer 122 may be further arranged between the first planarization layer 119 and the second planarization layer 121, and the plurality of fifth lines WL5 may be arranged on the first planarization layer 119. Thus, the plurality of fifth lines WL5 may extend toward the main display area MDA and the first corner display area CDA1, respectively, without using a bridge line as illustrated in FIG. 11A.

In this case, the plurality of fifth lines WL5 may be arranged across the main display area MDA, the first corner display area CDA1, and the second corner display area CDA2 in a straight line without being branched. The plurality of fifth lines WL5 may be any one of the data line DL (see FIG. 8) and the driving voltage line PL (see FIG. 8), and, therefore, the transmission time of a data signal or a driving voltage may be reduced.

Figure 13A:
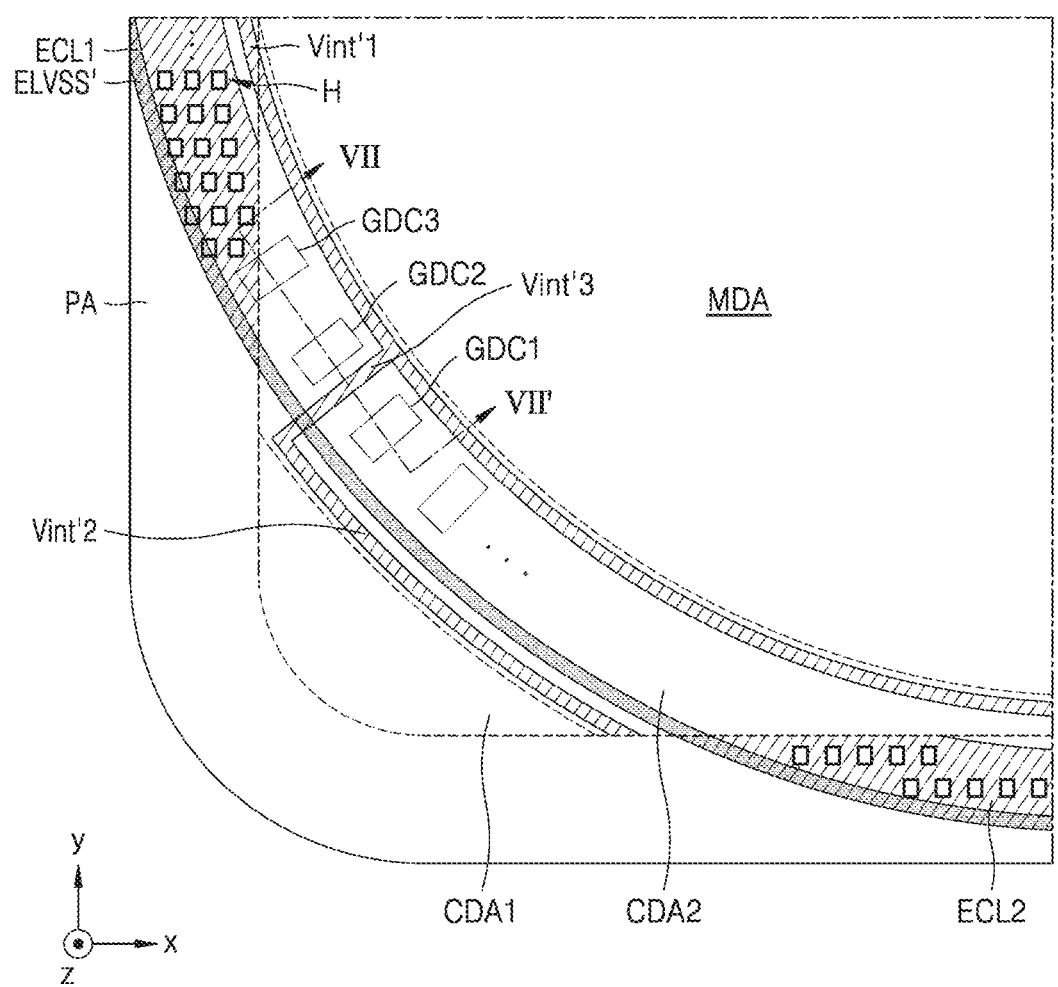
FIG. 13A is an enlarged plan view schematically illustrating a portion of FIG. 3.
Figure 13B:
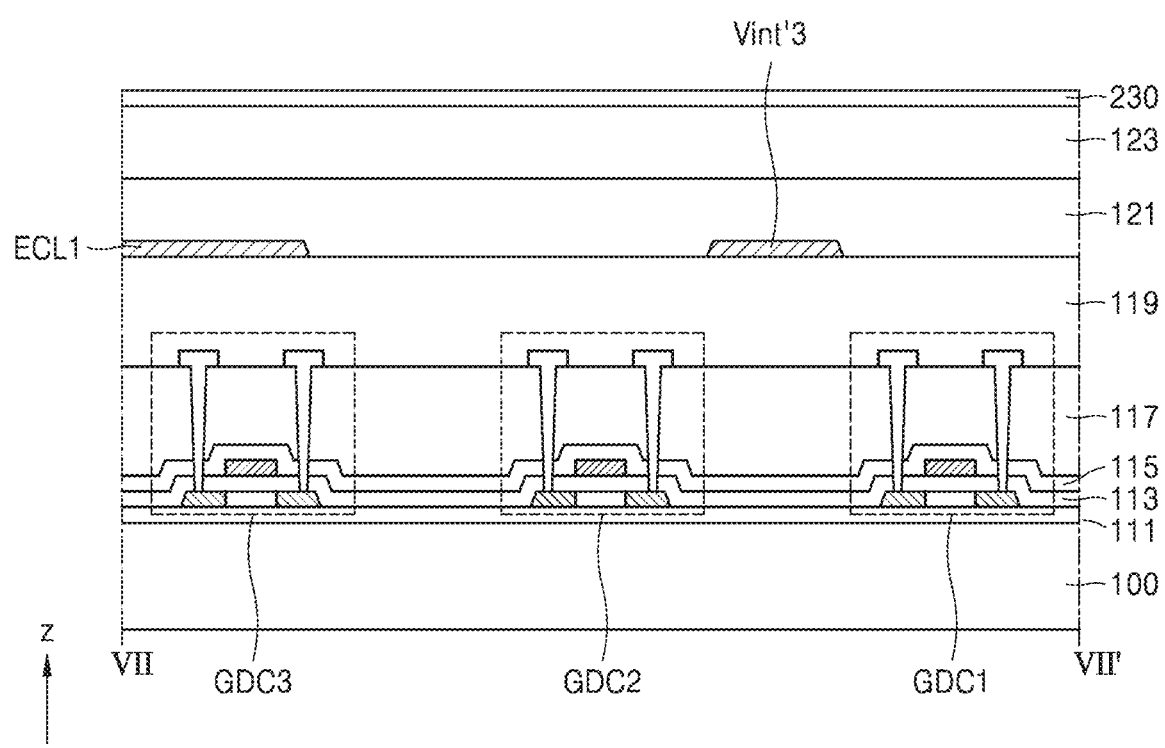
FIG. 13B is a cross-sectional view of a display panel according to an embodiment, which corresponds to a cross-section taken along line VII-VII' of FIG. 13A.
Figure 13C:
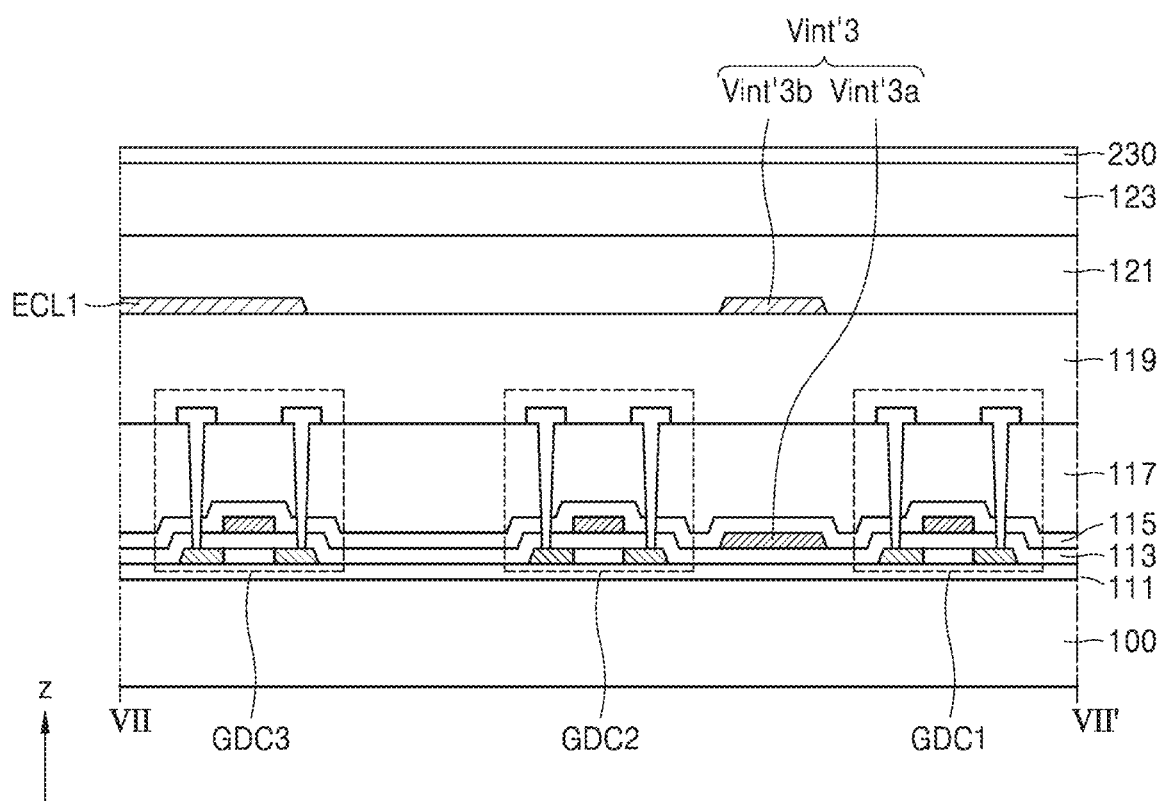
FIG. 13C is a cross-sectional view of a display panel according to an embodiment, which corresponds to a cross-section taken along line VII-VII' of FIG. 13A.
Figure 13D:
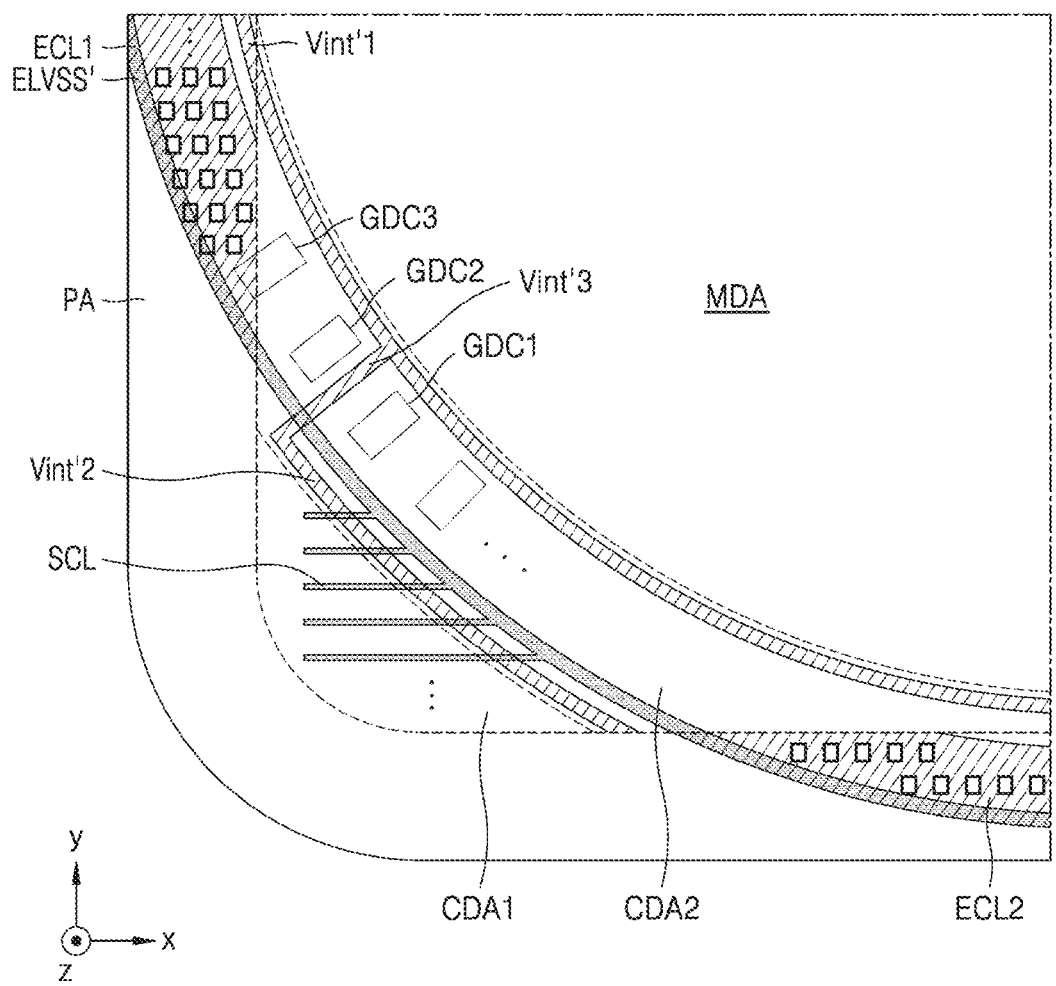
FIG. 13D is an enlarged plan view schematically illustrating a portion of FIG. 3.

FIGS. 13A and 13D are enlarged plan views schematically illustrating a portion of FIG. 3, and FIG. 13B is a cross-sectional view of a display panel according to an embodiment, which corresponds to a cross-section taken along line VII-VII' of FIG. 13A. FIG. 13C is a cross-sectional view of a display panel according to an embodiment, which corresponds to a cross-section taken along line VII-VII' of FIG. 13A. FIG. 13D correspond to a modified embodiment of FIG. 13A, and thus, it will be described below based on the difference from FIG. 13A.

Referring to FIG. 13A, the display panel 10 may include a first initialization voltage supply line Vint'1, a second initialization voltage supply line Vint'2, a third initialization voltage supply line Vint'3, a common voltage supply line ELVSS', a first common voltage connection line ECL1, and a second common voltage connection line ECL2. Also, the first gate driving circuit GDC1, the second gate driving circuit GDC2, and the third gate driving circuit GDC3 may be arranged in the second corner display area CDA2, and the first gate driving circuit GDC1, the second gate driving circuit GDC2, and the third gate driving circuit GDC3 may be arranged to be spaced apart from each other.

The first initialization voltage supply line Vint'1 may be arranged in a part of the second corner display area CDA2 adjacent to the main display area MDA, and the second initialization voltage supply line Vint'2 may be displayed in a part of the second corner display area CDA2 adjacent to the first corner display area CDA1.

As illustrated in FIGS. 13A and 13B, the third initialization voltage supply line Vint'3 may be arranged between the first gate driving circuit GDC1 and the second gate driving circuit GDC2 and may connect the first initialization voltage supply line Vint'1 and the second initialization voltage supply line Vint'2. Also, the third initialization voltage supply line Vint'3 may be arranged on the first planarization layer 119.

As another example, as illustrated in FIG. 13C, the third initialization voltage supply line Vint'3 may be a double line including a $(3-1)^{st}$ initialization voltage supply line Vint'3a and a $(3-2)^{nd}$ initialization voltage supply line Vint'3b. In this case, the $(3-1)^{st}$ initialization voltage supply line Vint'3a may be arranged on the first gate insulating layer 113, and the $(3-2)^{nd}$ initialization voltage supply line Vint'3b may be arranged on the first planarization layer 119.

In an embodiment, as illustrated in FIG. 13a, the first initialization voltage supply line Vint'1, the second initialization voltage supply line Vint'2, and the third initialization voltage supply line Vint'3 may be integrated. The first initialization voltage supply line Vint'1 may be configured to supply the initialization voltage Vint (see FIG. 8) to the main display area MDA, and the second initialization voltage supply line Vint'2 may be configured to supply the initialization voltage Vint to first corner display area CDA1.

The common voltage supply line ELVSS' may be arranged between the main display area MDA and the first corner display area CDA1 and may be configured to supply the common voltage ELVSS (see FIG. 8) to the main display area MDA and the first corner display area CDA1 through the first common voltage connection line ECL1 and the second common voltage connection line ECL2.

In an embodiment, as illustrated in FIG. 13D, the first corner display area CDDA1 may include a plurality of sub connection lines SCL connected to the common voltage supply line ELVSS'. The plurality of sub connection lines SCL may extend from the second corner display area CDA2 toward the first corner display area CDA1. That is, in a state where the display panel 10 is unfolded, the plurality of sub connection lines SCL may extend in the −x direction.

As described above with reference to FIG. 6A, the substrate 100 corresponding to the first corner display area CDA1 may include a plurality of islands 101 spaced apart from each other. Any one of the plurality of sub connection lines SCL may connect the plurality of islands 101 arranged in the same row and may be configured to supply the common voltage ELVSS through the sub connection line SCL to the plurality of islands 101 arranged in the same row. As such, the common voltage ELVSS may be separately provided to each pixel through the plurality of sub connection lines SCL.

Referring back to FIG. 13A, the first common voltage connection line ECL1 may be arranged in the peripheral area PA arranged on one side of the main display area MDA, and the second common voltage connection line ECL2 may be arranged in the peripheral area PA arranged on the other side of the main display area MDA. Each of the first common voltage connection line ECL1 and the second common voltage connection line ECL2 may be connected to the common voltage supply line ELVSS'. The first common voltage connection line ECL1 and the second common voltage connection line ECL2 may be formed of the same material as the first initialization voltage supply line Vint'1. Each of the first common voltage connection line ECL1 and the second common voltage connection line ECL2 may define a plurality of holes H, and for example, the plurality of holes H may be outgassing holes.

Also, the first common voltage connection line ECL1 may be disconnected at the boundary between the peripheral area PA and the second corner display area CDA2, and the second common voltage connection line ECL2 may also be disconnected at the boundary between the peripheral area PA and the second corner display area CDA2. That is, the first common voltage connection line ECL1 and the second common voltage connection line ECL2 may be arranged to be spaced apart by the second corner display area CDA2.

As a comparative example, the common voltage connection line may be integrally arranged in the corner area and the peripheral area without being disconnected. The pixel electrode connection line may be formed to arrange the light emitting device in the corner region. In this case, the pixel electrode connection line may be formed on the same layer as the common voltage connection line. When the common voltage connection line is integrally arranged in the corner region without being disconnected, the pixel electrode connection line may not be formed in the corner region. Thus, because the light emitting device may not be arranged in the corner area, an area in which the image is displayed may be reduced.

However, as in an embodiment, when the first common voltage connection line ECL1 and the second common voltage connection line ECL2 are arranged to be spaced apart by the second corner display area CDA2, the pixel electrode connection line PCL (see FIG. 9B) may be arranged on the second corner display area CDA2. Light emitting devices may be arranged in the second corner display area CDA2, and the light emitting devices may be driven by being connected through the pixel electrode connection line PCL to the pixel circuits arranged in the main display area MDA or the first corner display area CDA1. Thus, an image may be displayed in the second corner display area CDA2, and an area in which the image is displayed may be expanded.

Figure 14:
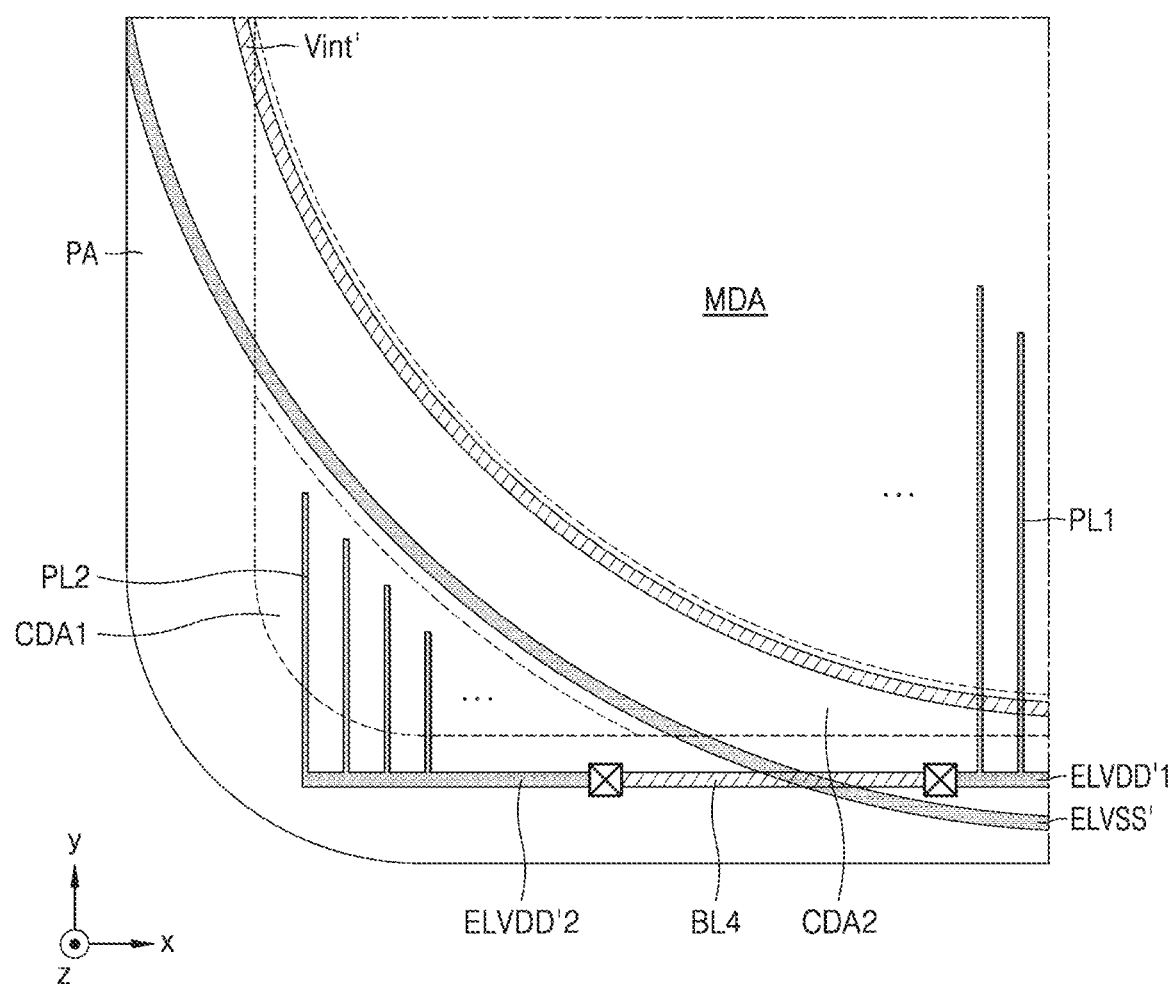
FIG. 14 is an enlarged plan view schematically illustrating a portion of FIG. 3.
Figure 15:
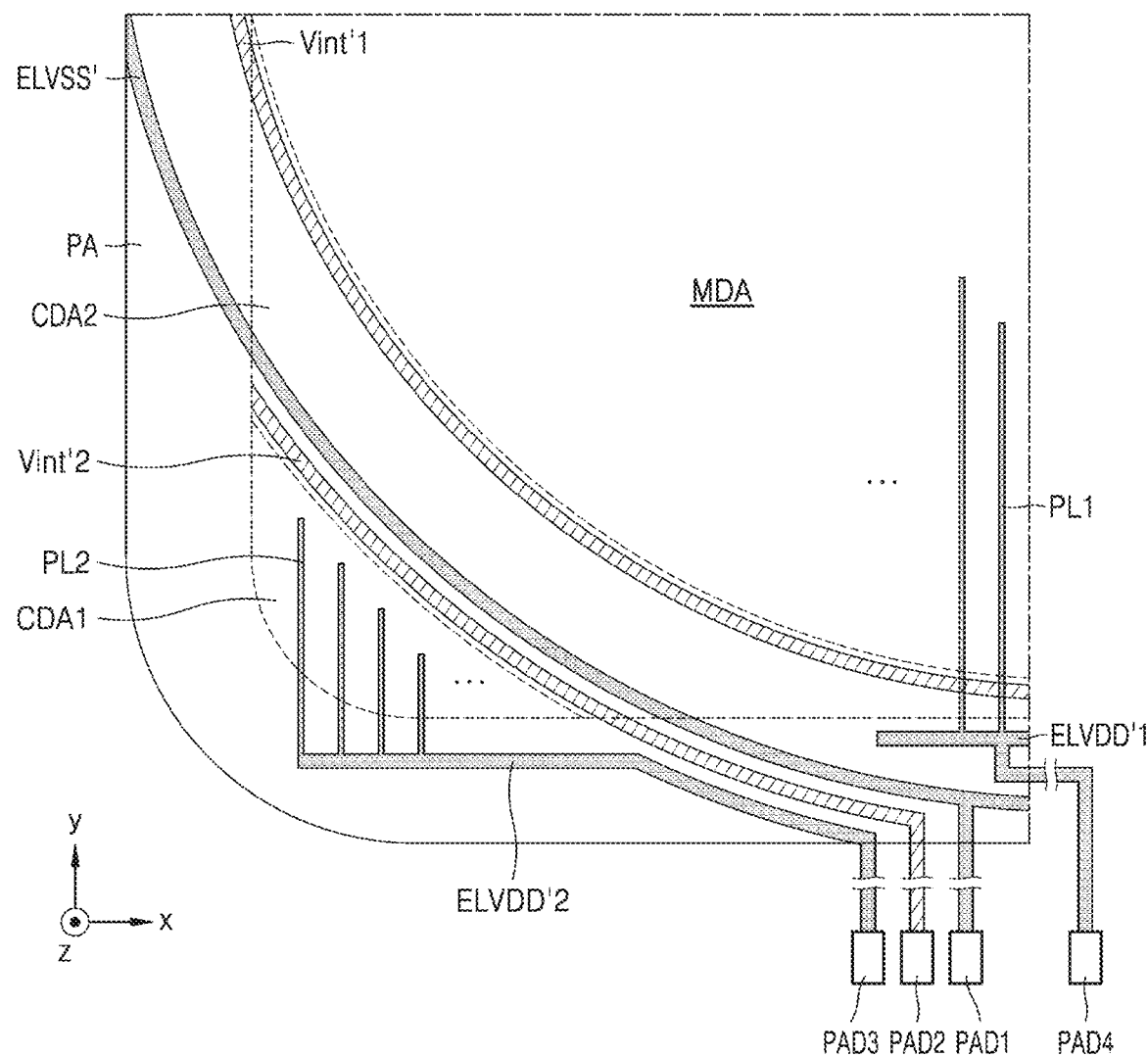
FIG. 15 is an enlarged plan view schematically illustrating a portion of FIG. 3.

FIGS. 14 and 15 are enlarged plan views schematically illustrating a portion of FIG. 3. Particularly, FIGS. 14 and 15 correspond to an enlargement of a partial corner portion of the display panel. In FIGS. 14 and 15, like reference numerals as those in FIG. 13A denote like members and thus redundant descriptions thereof will be omitted for conciseness Referring to FIG. 14, the display panel 10 may include an initialization voltage supply line Vint', a common voltage supply line ELVSS', a first driving voltage supply line ELVDD'1, a second driving voltage supply line ELVDD'2, a first driving voltage line PL1, and a second driving voltage line PL2.

The initialization voltage supply line Vint' and the common voltage supply line ELVSS' may be arranged between the main display area MDA and the first corner display area CDA1. The initialization voltage supply line Vint' and the common voltage supply line ELVSS' may respectively supply the initialization voltage Vint and the common voltage ELVSS to the main display area MDA and the first corner display area CDA1.

The first driving voltage supply line ELVDD'1 may be arranged in a part of the peripheral area PA adjacent to the main display area MDA, and the second driving voltage supply line ELVDD'2 may be arranged in a part of the peripheral area PA adjacent to the first corner display area CDA1. In this case, the first driving voltage supply line ELVDD'1 and the second driving voltage supply line ELVDD'2 may be connected through a fourth bridge line BL4. As illustrated in FIG. 12, the fourth bridge line BL4 may at least partially overlap the common voltage supply line ELVSS'.

The first driving voltage supply line ELVDD'1 and the second driving voltage supply line ELVDD'2 may be formed of the same material as the common voltage supply line ELVSS', and the fourth bridge line BL4 may be formed of the same material as the initialization voltage supply line Vint'. In other words, the first driving voltage supply line ELVDD'1 and the second driving voltage supply line ELVDD'2 may be formed on the same layer as the common voltage supply line ELVSS', and the fourth bridge line BL4 may be formed on the same layer as the initialization voltage supply line Vint'.

A plurality of first driving voltage lines PL1 may be connected to the first driving voltage supply line ELVDD'1 and may be arranged to extend toward the main display area MDA. A plurality of second driving voltage lines PL2 may be connected to the second driving voltage supply line ELVDD'2 and may be arranged to extend toward the first corner display area CDA1. Also, the number of pixels of one column respectively connected to the plurality of second driving voltage lines PL2 may vary. For example, as illustrated in FIG. 12, the number of pixels of one column respectively connected to some of the plurality of second driving voltage lines PL2 may decrease toward the +x direction.

Referring to FIG. 15, the display panel 10 may include a first initialization voltage supply line Vint'1, a second initialization voltage supply line Vint'2, a common voltage supply line ELVSS', a first driving voltage supply line ELVDD'1, a second driving voltage supply line ELVDD'2, a first driving voltage line PL1, and a second driving voltage line PL2.

The first initialization voltage supply line Vint'1, the second initialization voltage supply line Vint'2, and the common voltage supply line ELVSS' may be arranged between the main display area MDA and the first corner display area CDA1. The common voltage supply line ELVSS' may be connected to a first pad unit PAD1, and the second initialization voltage supply line Vint'2 may be connected to a second pad unit PAD2.

The first driving voltage supply line ELVDD'1 may be arranged in a part of the peripheral area PA adjacent to the main display area MDA, and the second driving voltage supply line ELVDD'2 may be arranged in a part of the peripheral area PA adjacent to the first corner display area CDA1. In this case, the first driving voltage supply line ELVDD'1 and the second driving voltage supply line ELVDD'2 may be respectively connected to a fourth pad unit PAD4 and a third pad unit PAD3.

When the first driving voltage supply line ELVDD'1 and the second driving voltage supply line ELVDD'2 are respectively connected to the fourth pad unit PAD4 and the third pad unit PAD3, a bridge line for connecting the first driving voltage supply line ELVDD'1 and the second driving voltage supply line ELVDD'2 may become unnecessary. Also, because a connection line for supplying the driving voltage ELVDD to each of the first driving voltage supply line ELVDD'1 and the second driving voltage supply line ELVDD'2 does not overlap other lines, a burnt phenomenon occurring when various lines overlap each other may be reduced.

A plurality of first driving voltage lines PL1 may be connected to the first driving voltage supply line ELVDD'1 and may be arranged to extend toward the main display area MDA. A plurality of second driving voltage lines PL2 may be connected to the second driving voltage supply line ELVDD'2 and may be arranged to extend toward the first corner display area CDA1. Also, the number of pixels respectively connected to the plurality of second driving voltage lines PL2 and located in the same column may vary. For example, as illustrated in FIG. 12, the number of pixels of one column respectively connected to some of the plurality of second driving voltage lines PL2 may decrease toward the +x direction.

Although only the display panel and the display apparatus have been mainly described above, the disclosure according to the invention is not limited thereto. For example, it may be said that a display panel manufacturing method and a display apparatus manufacturing method for manufacturing such a display panel and a display apparatus are also within the scope of the disclosure.

According to an embodiment described above, it may be possible to implement a display panel in which a display area where an image is displayed is expanded and a display apparatus including the display panel. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate including a main display area, a first corner display area, a second corner display area, and a peripheral area, wherein the second corner display area extends from a corner of the main display area, the first corner display area is disposed between the peripheral area and the second corner display area, and the peripheral area surrounds the main display area, the first corner display area and the second corner display area;
   a first gate driving circuit arranged on the second corner display area of the substrate;
   a first line connected to the first gate driving circuit and extending toward the main display area; and
   a second line connected to the first gate driving circuit and extending toward the first corner display area.

2. The display panel of claim 1, further comprising:
   a corner light emitting device arranged on the second corner display area of the substrate; and
   a pixel circuit connected to the corner light emitting device and which drives the corner light emitting device,
   wherein the pixel circuit is arranged in the main display area or the first corner display area.

3. The display panel of claim 2, wherein the pixel circuit includes:
   a semiconductor layer arranged on the substrate; and
   a gate electrode arranged on the semiconductor layer and overlapping at least a part of the semiconductor layer in a plan view,
   wherein the first line and the second line each include a same material as the gate electrode.

4. The display panel of claim 1, further comprising:
   a second gate driving circuit arranged in the second corner display area and spaced apart from the first gate driving circuit; and
   a first bridge line connected to the first line and the second line through contact holes and arranged between the first gate driving circuit and the second gate driving circuit.

5. The display panel of claim 1, wherein the first line and the second line are provided in plural,
   a $(1\text{-}1)^{st}$ line among the plurality of first lines is connected to a $(2\text{-}1)^{st}$ line among the plurality of second lines, and
   in a state where the substrate is unfolded, a virtual extending line of the $(2\text{-}1)^{st}$ line is on the same line as a $(1\text{-}2)^{nd}$ line.

6. The display panel of claim 1, wherein the first corner display area of the substrate includes:
   a plurality of strip portions extending from the second corner display area toward the peripheral area; and
   a plurality of through-portions is defined between the plurality of strip portions and passes through the substrate.

7. The display panel of claim 6, wherein an area of the plurality of through-portions varies with a force applied to the first corner display area.

8. The display panel of claim 1, wherein the first corner display area of the substrate includes:
   a plurality of islands;
   a plurality of connection portions connecting the plurality of islands to each other; and a plurality of through-portions is defined between the plurality of islands and the plurality of connection portions and passes through the substrate.

9. The display panel of claim 1, further comprising a third line arranged on the main display area, the first corner display area, and the second corner display area of the substrate and extending in a direction intersecting with the first line.

10. The display panel of claim 1, further comprising:
a first initialization voltage supply line arranged between the main display area and the first corner display area; and
a common voltage supply line arranged between the main display area and the first corner display area.

11. The display panel of claim 10, further comprising:
a first gate driving circuit and a second gate driving circuit arranged on the second corner display area of the substrate and spaced apart from each other;
a second initialization voltage supply line arranged in a part of the second corner display area adjacent to the first corner display area; and
a third initialization voltage supply line arranged in the second corner display area, connecting the first initialization voltage supply line to the second initialization voltage supply line, and arranged between the first gate driving circuit and the second gate driving circuit.

12. The display panel of claim 10, further comprising a plurality of sub connection lines connected to the common voltage supply line and extending from the second corner display area toward the first corner display area.

13. The display panel of claim 10, further comprising:
a first driving voltage supply line arranged in a part of the peripheral area adjacent to the main display area;
a second driving voltage supply line arranged in a part of the peripheral area adjacent to the first corner display area; and
a third bridge line connecting the first driving voltage supply line and the second driving voltage supply line.

14. The display panel of claim 13, further comprising:
a plurality of first driving voltage lines connected to the first driving voltage supply line and extending toward the main display area; and
a plurality of second driving voltage lines connected to the second driving voltage supply line and extending toward the first corner display area,
wherein the numbers of pixels respectively connected to the plurality of second driving voltage lines and located in a same column in the first corner display area are different from each other.

15. The display panel of claim 10, further comprising:
a first driving voltage supply line arranged in a part of the peripheral area adjacent to the main display area and connected to a first pad unit; and
a second driving voltage supply line arranged in a part of the peripheral area adjacent to the first corner display area and connected to a second pad unit.

16. A display apparatus comprising:
a display panel including a main display area, a first corner display area, and a second corner display area, wherein the second corner display area extends from a corner of the main display area, and the first corner display area is disposed outside the second corner display area and curved with a first curvature radius; and
a window covering the display panel,
wherein the display panel further includes:
a first gate driving circuit arranged in the second corner display area;
a first line connected to the first gate driving circuit and extending toward the main display area; and
a second line connected to the first gate driving circuit and extending toward the first corner display area.

17. The display apparatus of claim 16, wherein the first corner display area of the display panel includes:
a plurality of strip portions extending from the second corner display area; and
a plurality of through-portions is defined between the plurality of strip portions and passes through the display panel.

18. The display apparatus of claim 16, wherein the display panel further includes a third line arranged in the main display area, the first corner display area, and the second corner display area and extending in a direction intersecting with the first line.

19. The display apparatus of claim 16, wherein the main display area includes a front display area, a first side display area extending from a first side of the front display area and curved with a second curvature radius, and a second side display area extending from a second side of the front display area and curved with a third curvature radius, and
wherein the first corner display area is arranged between the first side display area and the second side display area.

* * * * *